(12) United States Patent
Hagihara

(10) Patent No.: US 9,035,229 B2
(45) Date of Patent: May 19, 2015

(54) IMAGING DEVICE

(71) Applicant: Olympus Corporation, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 297 days.

(21) Appl. No.: 13/785,986

(22) Filed: Mar. 5, 2013

(65) Prior Publication Data

US 2013/0234004 A1 Sep. 12, 2013

(30) Foreign Application Priority Data

Mar. 8, 2012 (JP) .................................. 2012-051481

(51) Int. Cl.
*G02B 21/36* (2006.01)
*H04N 5/378* (2011.01)
*H01L 27/14* (2006.01)
*H04N 5/357* (2011.01)

(52) U.S. Cl.
CPC ................ *H04N 5/378* (2013.01); *H01L 27/14* (2013.01); *H04N 5/3575* (2013.01)

(58) Field of Classification Search
CPC ...................................................... H04N 5/378
See application file for complete search history.

(56) References Cited

U.S. PATENT DOCUMENTS

| 8,854,520 | B2 * | 10/2014 | Ito et al. .................. 348/308 |
| 2012/0229666 | A1 * | 9/2012 | Hagihara ................... 348/222.1 |
| 2014/0209784 | A1 * | 7/2014 | Morita et al. .............. 250/208.1 |

FOREIGN PATENT DOCUMENTS

JP 2006-340044 A 12/2006

* cited by examiner

*Primary Examiner* — Tony Ko
(74) *Attorney, Agent, or Firm* — Westerman, Hattori, Daniels & Adrian, LLP

(57) ABSTRACT

In an imaging device, one end of a capacitive element is connected to a second input terminal to which a reference signal Ramp is applied, and the other end of the capacitive element is connected to a voltage source during a reset operation and to a voltage source after the reset operation through a switching element. As a result, the voltage of the second input terminal is changed such that a voltage difference between the first input terminal and the second input terminal becomes a voltage guaranteeing a comparison operation after the reset operation.

4 Claims, 15 Drawing Sheets

IMAGING DEVICE

BACKGROUND OF THE INVENTION

1. Field of the Invention

The present invention relates to an imaging device.

This application claims priority to and the benefit of Japanese Patent Application No. 2012-051481 filed on Mar. 8, 2012, the disclosure of which is incorporated by reference herein.

2. Description of Related Art

A configuration discussed in Japanese Unexamined Patent Application, First Publication No. 2006-340044 has been known as one of imaging devices using an AD conversion method according to a related art. First, a configuration and an operation of an imaging device discussed in Japanese Unexamined Patent Application, First Publication No. 2006-340044 will be described.

FIG. 14 illustrates a schematic configuration of a (C)MOS imaging device using an AD conversion method according to the related art discussed in Japanese Unexamined Patent Application, First Publication No. 2006-340044. An imaging device 1001 includes an imaging unit 1002, a vertical selecting unit 1012, a read current source unit 1005, an analog unit 1006, a column processing unit 1015, a reference signal generating unit 1016, a horizontal selecting unit 1014, an output unit 1017, a changing unit 1018, and a timing control unit 1020.

The timing control unit 1020 controls each component such as the vertical selecting unit 1012, the read current source unit 1005, the analog unit 1006, the column processing unit 1015, the reference signal generating unit 1016, the horizontal selecting unit 1014, and the output unit 1017. The imaging unit 1002 is configured such that unit pixels 1003 each having a photoelectric conversion element are arranged in the form of a matrix, and generates a pixel signal according to the amount of an incident electromagnetic wave and outputs the pixel signal to a vertical signal line 1013 disposed in each column.

The vertical selecting unit 1012 controls a row address or row scanning of the imaging unit 1002 through the row control line 1011 when driving each unit pixel 1003 of the imaging unit 1002. The horizontal selecting unit 1014 controls a column address or column scanning of a column AD converting unit 1030 of the column processing unit 1015. The read current source unit 1005 serves as a current source for reading the pixel signal from the imaging unit 1002 as a voltage signal. The analog unit 1006 executes amplification or the like as necessary.

The column processing unit 1015 includes the changing unit 1018 and the column AD converting unit 1030 disposed in each column of the imaging unit 1002. The changing unit 1018 is turned on (activated) and short-circuited to a voltage source supplying a predetermined voltage. The column AD converting unit 1030 converts an analog signal which is the pixel signal output from each unit pixel 1003 of the imaging unit 1002 in units of columns into digital data, and outputs the digital data. The reference signal generating unit 1016 is configured with, for example, an integrating circuit or a DAC circuit, and generates a reference signal Ramp whose level changes with passage of time in an inclined manner.

Next, a configuration of the column AD converting unit 1030 will be described. FIG. 15 illustrates a configuration of the column processing unit 1015 including the column AD converting unit 1030. Each column AD converting unit 1030 is configured to include a comparing unit 1031 and a measuring unit 1032 and the column AD converting units 1030 have the same configuration.

The comparing unit 1031 is a comparator circuit that includes a generally well-known differential amplifier as a basic configuration. The comparing unit 1031 compares the pixel signal output from the unit pixel 1003 of the imaging unit 1002 with the reference signal Ramp, and outputs a high-level signal, for example, when the reference signal Ramp is larger than the pixel signal but outputs a low-level signal, for example, when the reference signal Ramp is smaller than the pixel signal.

The measuring unit 1032 is configured with an up/down counter circuit, and measures a comparison time representing a time taken until the comparing unit 1031 finishes a comparison operation after the comparing unit 1031 starts the comparison operation. Thus, a measurement value of the comparison time according to a level of the pixel signal is obtained. The horizontal selecting unit 1014 is configured with a shift register, a decoder, or the like, and controls a column address or column scanning of each column AD converting unit 1030 in the column processing unit 1015. As a result, the AD-converted digital data is output to the output unit 1017 in order through the horizontal signal line.

A comparison operation by the comparing unit 1031 starts after voltages of two input terminals of the differential amplifier configuring the comparing unit 1031 are reset (balanced). The changing unit 1018 is disposed in the imaging device 1001 in order to prevent a trouble in which as a slight variation remains between the voltages of the two input terminals of the differential amplifier configuring the comparing unit 1031 after the reset operation, an output of the comparing unit 1031 is not inverted, or an output of the comparing unit 1031 is inverted immediately after the reference signal Ramp is input. The changing unit 1018 is configured with a switching element that supplies a voltage from a power source VDD to the comparing units 1031 of all columns.

Next, an operation of an AD conversion operation will be described. A concrete operation of the unit pixel 1003 will not be described, but a reset level and a signal level as the pixel signal are output from the unit pixel 1003.

First, after the reading of the reset level from the unit pixel 1003 is stabilized, the voltages of the two input terminals of the differential amplifier configuring the comparing unit 1031 are reset (balanced). Subsequently, a predetermined voltage is applied to the input terminal to which the reference signal Ramp is applied, through the changing unit 1018. Thereafter, the comparing unit 1031 compares the reference signal Ramp with the pixel signal using the predetermined voltage as a comparison start voltage. The measuring unit 1032 executes a measurement in a down-count mode, and a measurement value at a point in time at which a comparison ends is used as digital data of the reset level.

Subsequently, when the signal level from the unit pixel 1003 is read, the reset operation in the comparing unit 1031 and the change operation by the changing unit 1018 are not performed. After the reading of the signal level from the unit pixel 1003 is stabilized, the comparing unit 1031 compares the reference signal Ramp with the pixel signal using the predetermined voltage as the comparison start voltage. The measuring unit 1032 executes a measurement in an up-count mode, and a measurement value of the measuring unit 1032 at a point in time at which the comparison ends is used as digital data of a signal component (a signal obtained by subtracting the reset level from the signal level).

As described above, the pixel signal can be AD-converted. Further, even when a slight variation remains between the voltages of the two input terminals of the differential amplifier configuring the comparing unit 1031 after the reset operation, a predetermined voltage is applied to the input terminal to which the reference signal Ramp is applied, through the changing unit 1018. As a result, the voltage of the input terminal to which the reference signal Ramp is applied is higher than the voltage of the input terminal to which the pixel signal is applied. As a result, the output of the comparing unit 1031 can be reliably inverted during the comparison operation.

SUMMARY OF THE INVENTION

According to a first aspect of the present invention, an imaging device includes an imaging unit that includes unit pixels with a photoelectric conversion element arranged in a form of a matrix and outputs a pixel signal from the unit pixel, a reference signal generating unit that generates a reference signal increasing or decreasing with passage of time, a comparing unit that includes a differential amplifying unit and a reset unit, the differential amplifying unit including a first input terminal electrically connected with the unit pixel and a second input terminal electrically connected with the reference signal generating unit through a first capacitive element and comparing a voltage of the first input terminal with a voltage of the second input terminal, the reset unit resetting the voltage of the first input terminal and the voltage of the second input terminal, a measuring unit that measures a comparison time from a comparison start to a comparison end by the comparing unit, and a changing unit that changes the voltage of the second input terminal such that a voltage difference between the first input terminal and the second input terminal becomes a voltage guaranteeing a comparison operation by the comparing unit after a reset operation by the comparing unit. The changing unit includes a second capacitive element and a switching element, one end of the second capacitive element is connected to the second input terminal, and the other end of the second capacitive element is connected to a first voltage source during a reset operation by the reset unit and to a second voltage source different from the first voltage source after the reset operation by the reset unit through the switching element.

According to a second aspect of the present invention, in the imaging device according to the first aspect, the first voltage source is either a ground or a power source, and the second voltage source is the reference signal.

According to a third aspect of the present invention, in the imaging device according to the first and second aspects, the reference signal generating unit includes a third capacitive element and a constant current source, and generates the reference signal based on a voltage of one end of the third capacitive element by increasing or decreasing a voltage with respect to the voltage of the third voltage source based on a current generated by the constant current source after setting a voltage of one end of the third capacitive element to a voltage of a third voltage source.

DETAILED DESCRIPTION OF THE INVENTION

Hereinafter, embodiments of the present invention will be described with reference to the accompanying drawings.

(First Embodiment)

Figure 1:
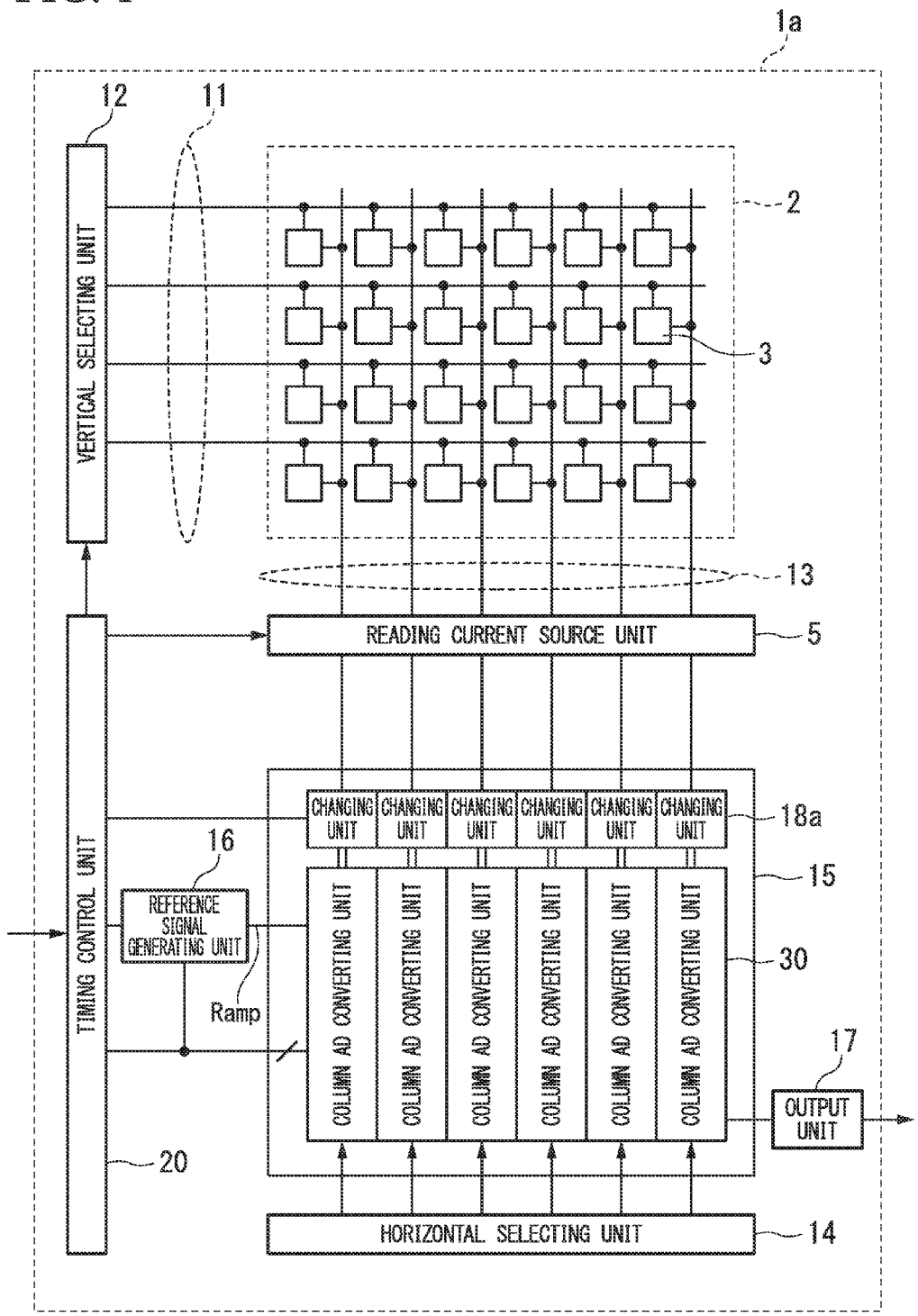
FIG. 1 is a block diagram illustrating a configuration of an imaging device according to a first embodiment of the present invention.

First, a first embodiment of the present invention will be described. FIG. 1 illustrates an example of a configuration of a (C)MOS imaging device according to the present embodiment. An imaging device 1a illustrated in FIG. 1 includes an imaging unit 2, a vertical selecting unit 12, a reading current source unit 5, a column processing unit 15, a reference signal generating unit 16, a changing unit 18a, a horizontal selecting unit 14, an output unit 17, and a timing control unit 20.

The imaging unit 2 is configured such that a plurality of unit pixels 3, which generates and outputs a pixel signal according to the amount of an incident electromagnetic wave, are arranged in the form of a matrix. The vertical selecting unit 12 selects each row of the imaging unit 2. The reading current source unit 5 reads a signal from the imaging unit 2 as a voltage signal. The reference signal generating unit 16 generates a reference signal Ramp (ramp wave) whose level slidingly changes with passage of time in an inclined manner. The column processing unit 15 is connected with the reference signal generating unit 16. The horizontal selecting unit 14 reads the AD-converted data to be output to the horizontal signal line. The output unit 17 outputs the digital data read by the horizontal selecting unit 14 to a circuit of a subsequent stage. The timing control unit 20 controls the respective components.

FIG. 1 illustrates the example of the imaging unit 2 configured with the unit pixels 3 of the 4×6 matrix for the sake of simplicity, but several tens to several tens of thousands of unit pixels 3 are actually arranged in each row and each column of the imaging unit 2. Although not shown in the drawing, the unit pixel 3 configuring the imaging unit 2 is configured with a photoelectric conversion element such as a photo-diode, a photo-gate, or a photo-transistor, and a transistor circuit.

The respective components will be described below in detail. The imaging unit 2 is configured such that the unit pixels 3 are two-dimensionally arranged in the form of a 4×6 matrix, and a row control line 11 is arranged on the 4×6 matrix of pixel array for each row. Each end of the row control line 11 is connected to the output terminal of an vertical selecting unit 12 corresponding to each row. The vertical selecting unit 12 is configured with a shift register, a decoder, or the like. The vertical selecting unit 12 controls a row address or row scanning of the imaging unit 2 through the row control line 11 when driving each unit pixel 3 of the imaging unit 2. A vertical signal line 13 is arranged on the pixel array of the imaging unit 2 for each column. The reading current source unit 5 is configured with a current source for reading the pixel signal from the imaging unit 2 as a voltage signal.

The column processing unit 15 includes a column AD converting unit 30 and a changing unit 18a which are disposed for each pixel column of the imaging unit 2, that is, for each vertical signal line 13. The column AD converting unit 30 converts an analog pixel signal read from each unit pixel 3 of the imaging unit 2 through the vertical signal line 13 for each pixel column into digital data. The changing unit 18a is disposed for each pixel column and configured with a capacitive element and a switching element as will be described later.

In the present embodiment, the column AD converting unit 30 is configured to be arranged in a one-to-one correspondence relation with the pixel column of the imaging unit 2. However, this is merely an example and not limited to this arrangement relation. For example, one column AD converting unit 30 may be arranged on a plurality of pixel columns, and one column AD converting unit 30 may be used by a plurality of pixel columns in a time division manner. The column processing unit 15 and the reference signal generating unit 16 which will be described later configure an analog-digital converting circuit that converts an analog pixel signal read from the unit pixel 3 of a selected pixel row of the imaging unit 2 into digital pixel data. The details of the column AD converting unit 30 will be described later.

According to control by the timing control unit 20, the reference signal generating unit 16 generates a so-called ramp wave whose level slidingly changes with passage of time in an inclined manner, and supplies the reference signal Ramp to the column AD converting unit 30 through the reference signal line.

The horizontal selecting unit 14 is configured with a shift register, a decoder, or the like, and controls a column address or column scanning of the column AD converting unit 30 of the column processing unit 15. According to control by the horizontal selecting unit 14, the digital data AD-converted by the column AD converting unit 30 is sequentially read out to the output unit 17 through the horizontal signal line.

The timing control unit 20 includes a functional block of a timing generator (TG) that supplies a clock or a pulse signal of a predetermined timing necessary for an operation of each component such as the vertical selecting unit 12, the reading current source unit 5, the changing unit 18a, the reference signal generating unit 16, the column processing unit 15, the horizontal selecting unit 14, or the output unit 17, and a functional block for performing communication with the TG.

The output unit 17 may have a signal processing function such as black level adjustment, column variation correction, or color processing in addition to a buffering function. Further, the output unit 17 may be configured to convert n-bit parallel digital data into serial data and output the serial data.

Figure 2:
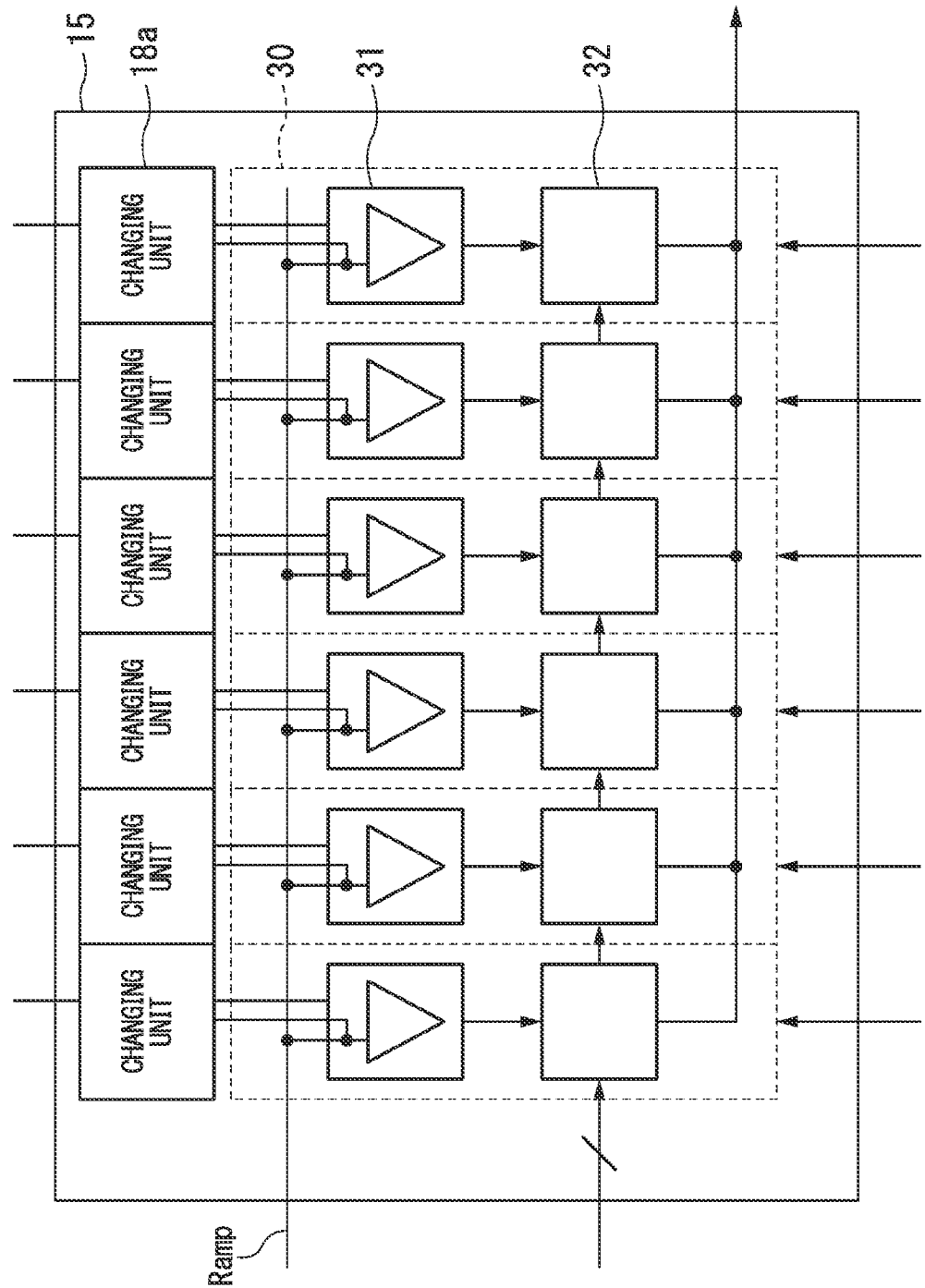
FIG. 2 is a block diagram illustrating a configuration of a column processing unit of the imaging device according to the first embodiment of the present invention.

Next, a configuration of the column AD converting unit 30 will be described. FIG. 2 illustrates an example of a configuration of the column processing unit 15 including the column AD converting unit 30. The column AD converting unit 30 is disposed for each column, and the six column AD converting units 30 are disposed in FIGS. 1 and 2. Each column AD converting unit 30 has the same configuration.

The column AD converting unit 30 compares the analog pixel signal read out from each unit pixel 3 of the imaging unit 2 through the vertical signal line 13 with the reference signal Ramp applied from the reference signal generating unit 16. Consequently, a pulse signal with a magnitude (pulse width) in a time axis direction according to each level of a reset level and a signal level is generated. Further, AD conversion is performed such that data corresponding to a period of time of the pulse width of the pulse signal is converted into digital data according to the level of the pixel signal.

A configuration of the column AD converting unit 30 will be described below in detail. The column AD converting unit 30 includes a comparing unit 31 and a measuring unit 32.

The comparing unit 31 compares the signal voltage according to the analog pixel signal which is output from the unit pixel 3 of the imaging unit 2 through the vertical signal line 13 and applied to its first input terminal with the reference signal Ramp which is supplied from the reference signal generating unit 16 and applied to its second input terminal. As a result, the level of the pixel signal is converted into information (the pulse width of the pulse signal) in the time axis direction. For example, a comparison output of the comparing unit 31 becomes a high level (H level) when the ramp voltage of the reference signal Ramp is higher than the signal voltage and becomes a low level (L level) when the ramp voltage is the signal voltage or less.

The measuring unit 32 is configured with, For example, an n-bit up/down counter circuit that measures a comparison time representing a time from a comparison start to a comparison end by the comparing unit 31. For example, n bits are 10 bits. The case in which n bits are 10 bits is an example, and n bits may be less than 10 bits (for example, 8 bits) or may be more than 10 bits (for example, 12 bits). Further, the measuring unit 32 is not limited to the up/down counter circuit.

Figure 3:
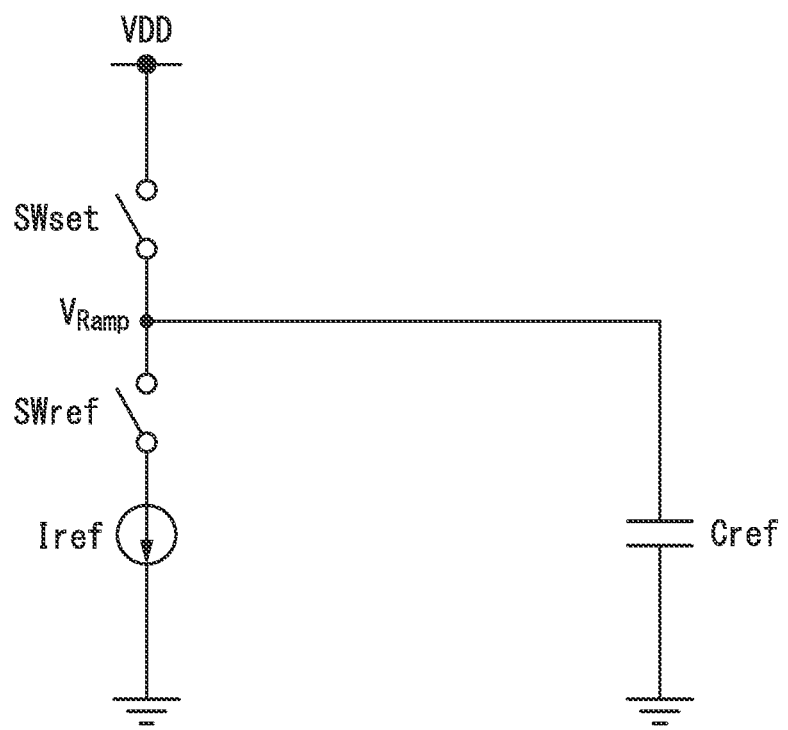
FIG. 3 is a block diagram illustrating a configuration of a reference signal generating unit of the imaging device according to the first embodiment of the present invention.

Next, a configuration and an operation of the reference signal generating unit 16 will be described. FIG. 3 illustrates an example of a configuration of the reference signal generating unit 16. The reference signal generating unit 16 includes a capacitive element Cref (a third capacitive element), a constant current source Iref, and switching elements SWset and SWref. The switching element SWset is a switch for setting a voltage of the capacitive element Cref to a voltage value $V_{DD}$ of a power source VDD. The switching element SWref is a switch for turning on or off a current of the constant current source Iref.

One end of the switching element SWset is connected to the power source VDD. One end of the switching element SWref is connected to the other end of the switching element SWset. One end of the constant current source Iref is connected to the other end the switching element SWref. The other end of the constant current source Iref is connected to the ground. One end of the capacitive element Cref is connected to the other end of the switching element SWset, and the other end of the capacitive element Cref is connected to the ground. On/off operations of the switching elements SWset and SWref are controlled by a control signal from the timing control unit 20. The voltage $V_{Ramp}$ of one end of the capacitive element Cref is output as the reference signal Ramp. The reference signal generating unit 16 may be configured such that a capacitance value of the capacitive element Cref and a current value of the constant current source Iref can vary.

Next, an operation of the present embodiment will be described. Here, a detailed operation of the unit pixel 3 will not be described, but the reset level and the signal level are output from the unit pixel 3 as is well known in the art.

The AD conversion is performed as follows. For example, the ramp wave (the reference signal Ramp) that drops with a predetermined inclination is compared with each voltage of the reset level or the signal level of which the pixel signal from the unit pixel 3. A period of time from a point in time at which the ramp wave used in the comparing process is generated to a point in time at which the signal according to the reset level or the signal level matches the ramp wave (the ramp voltage) is measured, for example, using a reference clock. As a result, digital data corresponding to each level of the reset level or the signal level is obtained.

Here, the reset level including noise of the pixel signal is read out from each unit pixel 3 of the selected row of the imaging unit 2 as the analog pixel signal in a first reading operation. Thereafter, the signal level is read out in a second reading operation. Then, the reset level and the signal level are input to the column AD converting unit 30 through the vertical signal line 13 in time series.

Figure 4:
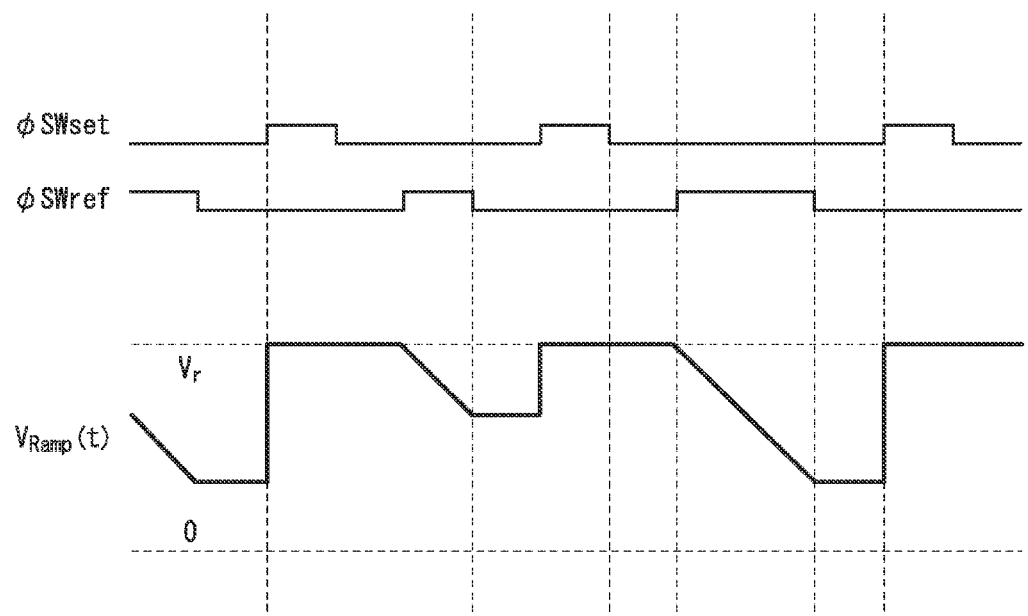
FIG. 4 is a timing chart illustrating an operation of the reference signal generating unit of the imaging device according to the first embodiment of the present invention.

FIG. 4 illustrates an example of an operation of the reference signal generating unit 16. Referring to FIG. 4, φSWset represents a control signal which is supplied from the timing control unit 20 to the switching element SWset. φSWref represents a control signal which is supplied from the timing control unit 20 to the switching element SWref. $V_{Ramp}(t)$ represents a voltage of the reference signal Ramp (a voltage of one end of the capacitive element Cref).

At the time of the first reading, the control signal φSWset transitions from the L level to the H level, and thus the switching element SWset is turned on. The voltage $V_{Ramp}(t)$ of the reference signal Ramp is set to $V_{DD}$. Subsequently, the control signal φSWset transitions from the H level to the L level, and thus the switching element SWset is turned off. Thereafter, the control signal φSWref transitions from the L level to the H level, and thus the switching element SWref is turned on. Here, after a point in time (a time t=0) at which the switching element SWref is turned on, the voltage $V_{Ramp}(t)$ of the reference signal Ramp at a time t is obtained as in the following Equation (1). In Equation (1), $I_{REF}$ represents the current value of the constant current source Iref, and $C_{REF}$ represents the capacitance value of the capacitive element Cref.

$$V_{Ramp}(t) = V_{DD} - \frac{I_{REF}}{C_{REF}} \times t \quad (1)$$

As be able to be understood from Equation (1), the reference signal Ramp is generated such that a voltage based on the current value $I_{REF}$ generated by the constant current source Iref is subtracted (or a voltage based on the current value $-I_{REF}$ generated by the constant current source Iref is added) from the voltage value $V_{DD}$ of the power source VDD.

When a predetermined time elapses, the control signal φSWref transitions from the H level to the L level, so the switching element SWref is turned off, and the reference signal generating unit 16 stops the generating of the reference signal Ramp. As a result, the first reading operation of the reference signal generating unit 16 ends.

Subsequently, at the time of second reading, the control signal φSWset transitions from the L level to the H level, so the switching element SWset is turned on, and the voltage $V_{Ramp}(t)$ of the reference signal Ramp is set to $V_{DD}$. Subsequently, the control signal φSWset transitions from the H level to the L level, therefore the switching element SWset is turned off, and the control signal φSWref transitions from the L level to the H level, therefore the switching element SWref is turned on. The voltage $V_{Ramp}(t)$ of the subsequent reference signal Ramp follows Equation (1). When a predetermined time elapses, the control signal φSWref transitions from the H level to the L level, therefore the switching element SWref is turned off, and the reference signal generating unit 16 stops generating the reference signal Ramp. As a result, the second reading operation of the reference signal generating unit 16 ends.

The AD conversion operation by the reference signal generating unit 16, the changing unit 18a, the comparing unit 31, and the measuring unit 32 is performed as follows.

<First Reading>

After first reading out from the unit pixel 3 of an arbitrary pixel row to the vertical signal line 13 is stabilized, the reset operation of the comparing unit 31 is performed. In the reference signal generating unit 16, a voltage of one end of the capacitive element Cref is set to $V_{DD}$.

Subsequently, the changing unit 18a changes the voltage of the second input terminal of the comparing unit 31 to which the reference signal Ramp is applied to a predetermined voltage having a level higher than the reset level. Then, the timing control unit 20 supplies a control data for generating a ramp wave to the reference signal generating unit 16. The reference signal generating unit 16 receives the control data, and outputs the reference signal Ramp whose waveform changes with passage of time in a ramp form as a whole as a comparison voltage applied to the second input terminal of the comparing unit 31. The comparing unit 31 compares the voltage of the second input terminal to which the reference signal Ramp from the reference signal generating unit 16 is applied with the voltage of the first input terminal to which the reset level is applied, and inverts the comparison output when the both of voltages are substantially equal to each other.

The measuring unit 32 starts measurement in the down-count mode in accordance with start of the comparison in the comparing unit 31, and holds a measurement value at a point in time at which the comparison output of the comparing unit 31 is inverted. That is, the measuring unit 32 holds the digital data according to the reset level. When a predetermined time elapses, the timing control unit 20 stops the supplying of the control data to the reference signal generating unit 16 and the outputting of the reference clock. As a result, the reference signal generating unit 16 stops generating the reference signal Ramp.

<Second Reading>

Subsequently, a signal level according to the amount of an incident light of each unit pixel 3 is read out at the time of second reading. At the time of the second reading, the reset operation of the comparing unit 31 and the change operation by the changing unit 18a are not performed. In the reference signal generating unit 16, a voltage of one end of the capacitive element Cref is set to $V_{DD}$.

After second reading from the unit pixel 3 of an arbitrary pixel row to the vertical signal line 13 is stabilized, the timing control unit 20 supplies a control data for generating the ramp wave to the reference signal generating unit 16. The reference signal generating unit 16 receives the control data and outputs the reference signal Ramp. The comparing unit 31 compares the voltage of the second input terminal to which the reference signal Ramp from the reference signal generating unit 16 is applied with the voltage of the first input terminal to which the signal level is applied, and inverts the comparison output when both of the voltages are substantially equal to each other.

The measuring unit 32 starts measurement in the up-count mode in accordance with start of the comparison in the comparing unit 31, and holds a measurement value at a point in time at which the comparison output of the comparing unit 31 is inverted. That is, the measuring unit 32 holds digital data according to a signal component obtained by subtracting the reset level from the signal level (performing a correlated double sampling (CDS)). When a predetermined time elapses, the timing control unit 20 stops supplying the control data to the reference signal generating unit 16 and outputting the reference clock. As a result, the reference signal generating unit 16 stops generating the reference signal Ramp.

Figure 5:
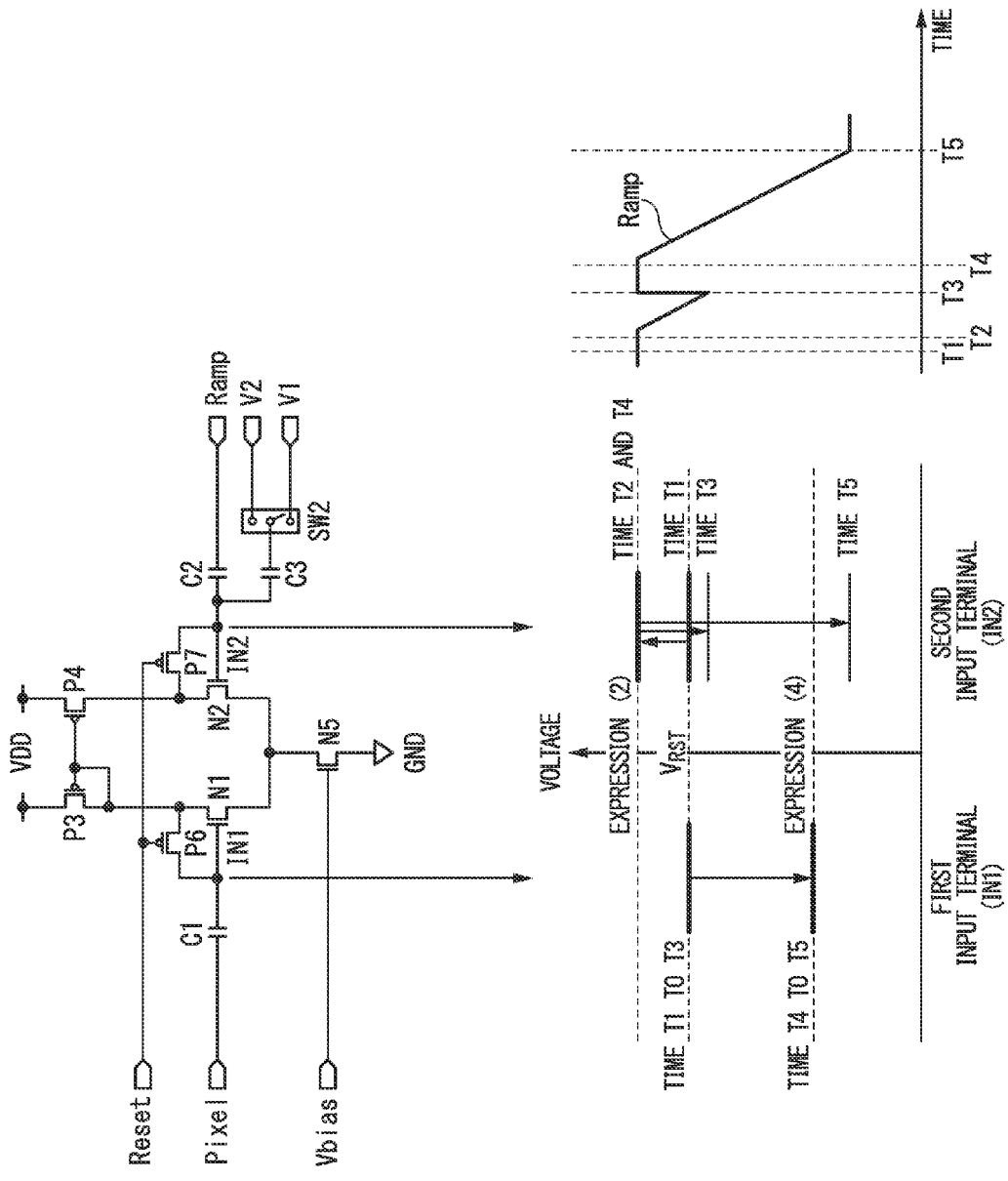
FIG. 5 is a diagram illustrating a configuration of a comparing unit and a changing unit of the imaging device according to the first embodiment of the present invention and a voltage change in the input terminal of the comparing unit.

Next, the details of configurations of the comparing unit 31 and the changing unit 18a and a voltage change in the input terminal of the comparing unit 31 will be described. FIG. 5 illustrates an example of a concrete circuit configuration of the comparing unit 31 and the changing unit 18a. A circuit configuration of the present embodiment will be described below.

Referring to FIG. 5, the differential amplifier of the comparing unit 31 includes NMOS transistors N1 and N2 whose sources are commonly connected to each other, PMOS transistors P3 and P4 which are connected between drains of the transistors N1 and N2 and the power source VDD and have gates commonly connected to each other, and an NMOS current source N5 connected between a node commonly connected to the sources of the transistors N1 and N2 and a ground GND.

In the differential amplifier, PMOS transistors P6 and P7 are connected between gates and drains of the transistors N1 and N2. The transistors P6 and P7 are turned on when a reset pulse Reset of a low active is applied from the timing control unit 20 to the each gate thereof. The transistors P6 and P7 function as a reset unit that causes the gates and the drains of the transistors N1 and N2 to be short-circuited to each other and resets voltages of the gates of the transistors N1 and N2, that is, voltages of the two input terminals IN1 and IN2 of the differential amplifier.

The gates of the transistors N1 and N2 are connected to one ends of capacitive elements C1 and C2 for cutting the DC level, respectively. A pixel signal Pixel output from each unit pixel 3 of the imaging unit 2 is applied to the other end of the capacitive element C1. The reference signal Ramp from the reference signal generating unit 16 is applied to the other end of the capacitive element C2 (first capacitive element).

A capacitive element C3 (second capacitive element) and a switching element SW2 configure the changing unit 18a. One end of the capacitive element C3 is connected to the gate of the transistor N2, and the other end of the capacitive element C3 is connected to a first terminal of the switching element SW2. A second terminal of the switching element SW2 is connected to a voltage source V1 (first voltage source). A third terminal of the switching element SW2 is connected to a voltage source V2 (second voltage source). The switching element SW2 performs switching a state in which the first terminal is short-circuited to the second terminal and the voltage source V1 is connected to the other end of the capacitive element C3, and a state in which the first terminal is short-circuited to the third terminal and so the voltage source V2 is connected to the other end of the capacitive element C3 in response to a control signal (not shown) from the timing control unit 20. A bias voltage Vbias for controlling a current value is applied to the gate of the current source N5.

An operation according to the present embodiment will be described below. Here, the voltage of the voltage source V1 is represented by $V_1$, the voltage of the voltage source V2 is represented by $V_2$ (here, $V_1 < V_2$), the voltage of the reset level is represented by $V_R$, the voltage of the signal level is represented by $V_S$ (here, $V_S \leq N_R$), the capacitance value of the capacitive element C2 is represented by $C_2$, and the capacitance value of the capacitive element C3 is represented by $C_3$. FIG. 5 illustrates a voltage change of the first input terminal IN1 and the second input terminal IN2 of the differential amplifier of the comparing unit 31 and the waveform of the reference signal Ramp.

The reset level applied to the first input terminal IN1 as the pixel signal Pixel from the unit pixel 3 and the reference signal Ramp applied from the reference signal generating unit 16 to the second input terminal IN2 are stabilized, and then the reset pulse Reset is activated (low active) before the timing control unit 20 causes the comparing unit 31 to start a comparison operation. As a result, the transistors P6 and P7 are turned on to cause the gates and the drains of the transistors N1 and N2 to be short-circuited to each other, and the voltages of the two input terminals are reset using the drain voltage as the operation points of the transistors N1 and N2. During the reset operation, the other end of the capacitive element C3 remains connected to the voltage source V1 by the switching element SW2.

At the operation point determined by the reset, an offset component between the voltages of the two input terminals of the differential amplifier, i.e., an offset component of the gate voltages of the transistors N1 and N2, is almost canceled. In other words, the reset operation is performed so that the voltages of the two input terminals of the differential amplifier become almost the same voltage $V_{RST}$. At this point in time (a time T1), the voltage of the first input terminal IN1 is $V_{RST}$, and the voltage of the second input terminal IN2 is $V_{RST}$. After the reset operation, the transistors P6 and P7 are turned off.

Subsequently, the switching element SW2 causes the other end of the capacitive element C3 to be connected to the voltage source V2. As a result, the voltage of the second input terminal IN2 to which the reference signal Ramp is applied, that is, the gate voltage of the transistor N2, is changed from the voltage $V_{RST}$ to a predetermined high voltage. During the reset operation and the change operation, one end of the capacitive element Cref of the reference signal generating unit 16 is connected to the power source VDD. The voltage of the other end of the capacitive element C3 changes from $V_1$ to $V_2$ by ($V_2 - V_1$). Thus, at this point in time (a time T2), the voltage $V_{IN2}$ of the second input terminal IN2 is obtained by the following Equation (2).

$$V_{IN2} = V_{RST} + \frac{C_3}{C_2 + C_3} \times (V_2 - V_1) \tag{2}$$

After the reset operation of the comparing unit 31, even when a slight variation remains between the voltages of the two input terminals of the differential amplifier configuring the comparing unit 31, $V_1$ is smaller than $V_2$. Thus, the voltage (Equation (2)) of the second input terminal IN2 when the comparing unit 31 starts the comparison operation for the first reading is higher than the voltage ($V_{RST}$) of the first input terminal IN1. As illustrated in FIG. 5, the ramp wave that decreases with passage of time is applied as the reference signal Ramp. As a result, the output of the comparing unit 31 is possible to be inverted during the comparison operation reliably, and the comparison operation by the comparing unit 31 is possible to be guaranteed.

After the time T2, one end of the capacitive element Cref of the reference signal generating unit 16 is connected to the constant current source Iref, and the ramp wave is applied to the second input terminal as the reference signal Ramp. The voltage $V_{IN2}$ of the second input terminal IN2 after a point in time at which the ramp wave is applied to the second input terminal is obtained by the following Equation (3). A third term on the right side of Equation (3) is a component generated as the voltage of the ramp wave changes from $V_{Ramp}(0)$ ($=V_{DD}$) to $V_{Ramp}(t)$ by ($V_{Ramp}(t)-V_{DD}$).

$$V_{IN2} = V_{RST} + \frac{C_3}{C_2+C_3} \times (V_2 - V_1) + \frac{C_3}{C_2+C_3} \times (V_{Ramp}(t) - V_{DD}) \quad (3)$$

The comparison output of the comparing unit 31 is inverted at a timing at which the voltage of the second input terminal to which the ramp wave is applied is substantially equal to the voltage of the reset first input terminal. The reference signal generating unit 16 stops the generating of the ramp wave at a point in time (a time T3) at which a predetermined time elapses after the ramp wave starts to be input to the second input terminal.

Subsequently, the signal level is applied to the first input terminal IN1 as the pixel signal Pixel from the unit pixel 3. The voltage of the other end of the capacitive element C1 to which the reset level is applied as the pixel signal Pixel is $V_R$ at a point in time (a time T2) at which the other end of the capacitive element C3 is connected to the voltage source V2 by the switching element SW2. The voltage of the other end of the capacitive element C1 is $V_S$ at a point in time (a time T4) at which the signal level is input as the pixel signal Pixel. Thus, the voltage $V_{IN1}$ of the first input terminal IN1 at the time T4 is obtained by the following Equation (4). At this point in time (the time T4), one end of the capacitive element Cref of the reference signal generating unit 16 is connected to the power source VDD.

$$V_{IN1} = V_{RST} + (V_S - V_R) \quad (4)$$

At the time T4 of the second reading, the voltage of the second input terminal IN2 to which the reference signal Ramp is applied is obtained by Equation (2). Since $V_1$ is smaller than $V_2$ in Equation (2) and $V_S$ is smaller than or equal to $V_R$ in Equation (4), the voltage $V_{IN2}$ of Equation (2) is higher than the voltage $V_{IN1}$ of Equation (4). In other words, the voltage of the second input terminal IN2 when the comparing unit 31 starts the comparison operation for the second reading is higher than the voltage of the first input terminal IN1. As illustrated in FIG. 5, the ramp wave that decreases over time is applied as the reference signal Ramp. As a result, the output of the comparing unit 31 is possible to be inverted during the comparison operation reliably, and the comparison operation by the comparing unit 31 is possible to be guaranteed.

After the time T4, one end of the capacitive element Cref of the reference signal generating unit 16 is connected to the constant current source Iref, and the ramp wave is applied to the second input terminal as the reference signal Ramp. The voltage $V_{IN2}$ of the second input terminal IN2 after a point in time at which the ramp wave is applied to the second input terminal is obtained by Equation (3). The comparison output of the comparing unit 31 is inverted at a timing at which the voltage of the second input terminal to which the ramp wave is applied is substantially equal to the voltage of the first input terminal. The reference signal generating unit 16 stops the generating of the ramp wave at a point in time (a time T5) at which a predetermined time elapses after the ramp wave starts to be input to the second input terminal. The measuring unit 32 performs measurement in the down-count mode during the first reading, and the measuring unit 32 performs measurement in the up-count mode during the second reading. As a result, the measurement value for a second term ($V_S-V_R$) on the right side of Equation (4) is obtained as the measurement value of the measuring unit 32.

As described above, according to the present embodiment, after the reset operation by the transistors P6 and P7, the changing unit 18a (the capacitive element C3 and the switching element SW2) changes the voltage of the second input terminal IN2 to a higher voltage such that the voltage difference between the first input terminal IN1 and the second input terminal IN2 is the voltage guaranteeing the comparison operation by the comparing unit 31. Thus, the comparing unit 31 is possible to perform the comparison operation of the reference signal Ramp and the pixel signal Pixel reliably.

Figure 14:
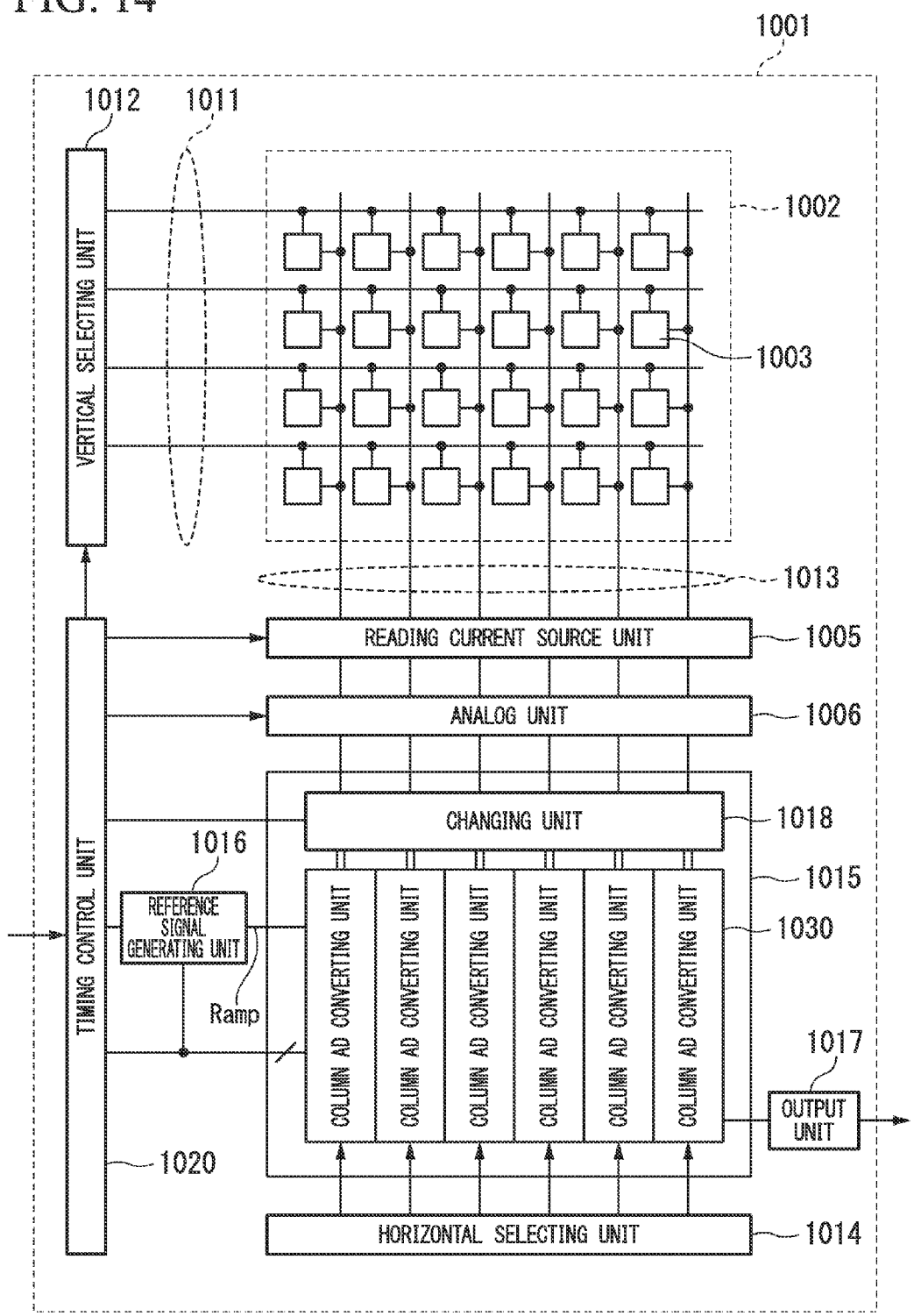
FIG. 14 is a block diagram illustrating a configuration of an imaging device according to a related art.
Figure 15:
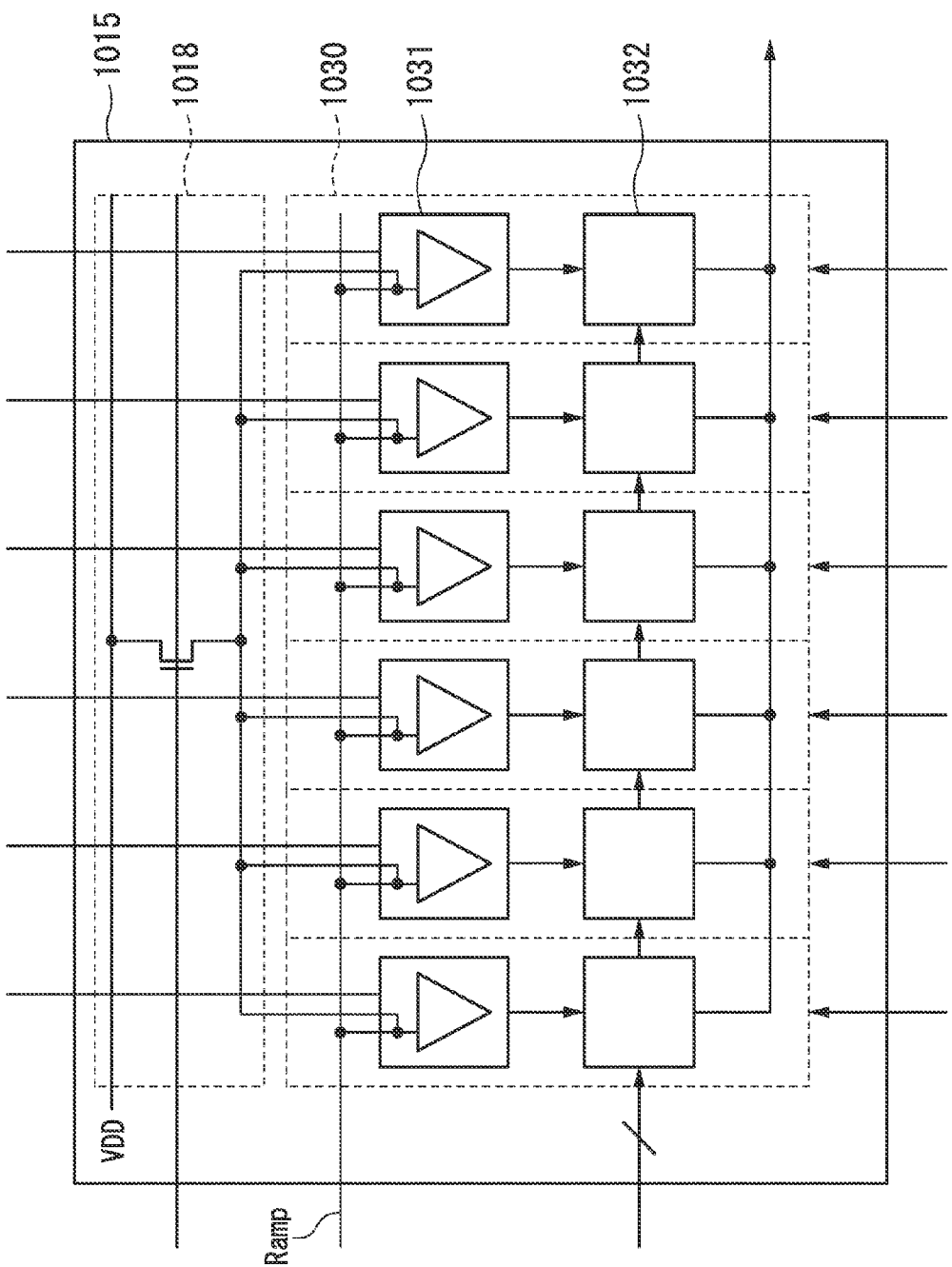
FIG. 15 is a block diagram illustrating a configuration of a column processing unit of the imaging device according to the related art.

As described above, neighboring columns of the imaging device are almost the same in manufacturing condition variation, but a manufacturing condition variation may increase among all columns of the imaging device. A case in which the reset variation $\Delta V_{RST}$ is almost 100 [mV] is considered. The imaging device (FIGS. 14 and 15) of the related art is configured such that the voltage of the input terminal of the differential amplifier is directly changed by a switching element which is common to all columns. Thus, the voltage of the input terminal of the differential amplifier needs to be changed to a voltage containing the reset variation $\Delta V_{RST}$. Thus, the voltage of the input terminal of the differential amplifier is changed to a voltage which is higher than necessary, as a result, it takes a time for the comparing unit 31 to perform the comparison operation, and an AD conversion time increases.

On the other hand, in the present embodiment, the voltage of the input terminal of the differential amplifier is changed by performing a predetermined voltage change through the capacitive element C3. The manufacturing condition variation of the two input terminals of the same differential amplifier is small, and thus the reset variation is small. Thus, in order to give a predetermined voltage change, it is only necessary to consider the reset variation of the two input terminals of the same differential amplifier, and thus the voltage of the input terminal of the differential amplifier does not change to be higher than necessary. As a result, the AD conversion time is possible to be reduced compared to the imaging device of the related arts. Thus, the AD conversion is possible to be performed at a high speed.

The reference signal generating unit 16 according to the present embodiment is configured to generate the reference signal Ramp by charging and discharging of the capacitive element Cref as illustrated in FIG. 3. On the other hand, as another configuration of the reference signal generating unit, the reference signal generating unit may be configured to include a resistor whose one end is connected to a power source and a current source whose one end is connected to the other end of the resistor, and output the voltage of the other end of the resistor as the reference signal while changing the current value of the current source.

When the resistor is represented by R1 and a synthetic capacitor of the capacitive element C2 and the comparing unit 31 viewed from the output terminal of the reference signal generating unit is represented by C, a target time constant r until a voltage change given to the second input terminal IN2 of the comparing unit 31 is stabilized is represented by $\tau = R1 \times C$. When the reference signal generating unit 16 has the configuration of FIG. 3, a resistive component determining the time constant $\tau$ is an internal resistor of the power source VDD. When the internal resistor of the power source VDD is represented by R2, the time constant z is represented by $\tau = R2 \times C$, where R2 is much smaller than R1. In other words, the time constant of the reference signal generating unit 16 according to the present embodiment is smaller than the time constant of the reference signal generating unit including the resistor and the current source. Thus, as the reference signal generating unit 16 has the configuration of FIG. 3, a time taken until the voltage change applied to the second input terminal IN2 of the comparing unit 31 is stabilized is further reduced.

Thus, a time until the reference signal Ramp is stabilized after the reference signal Ramp is applied to the second input terminal IN2 of the comparing unit 31 is possible to be further reduced. Thus, the AD conversion is possible to be performed at a high speed. Further, the reference signal Ramp is possible to be generated by a simple circuit configuration.

(Second Embodiment)

Next, a second embodiment of the present invention will be described. A (C)MOS imaging device according to the present embodiment has a configuration similar to the configuration (FIG. 1) described in the first embodiment but differs in the AD conversion operation from that of the first embodiment.

The following description will proceed with a portion of an operation according to the present embodiment which is different from the first embodiment. Similarly to the first embodiment, the unit pixel 3 outputs the reset level and the signal level.

The AD conversion is performed as follows. For example the ramp wave (the reference signal Ramp) that drops with a predetermined inclination is compared with a voltage (a differential signal level) according to the difference between the reset level and the signal level of the pixel signal from the unit pixel 3. A period of time from a point in time at which the ramp wave used in the comparing process is generated to a point in time at which the signal according to the differential signal level matches the ramp wave (the ramp voltage) is measured, for example, using a reference clock. As a result, digital data corresponding to the level of the differential signal level is obtained.

Here, the reset level is read out from each unit pixel 3 of the selected row of the imaging unit 2 as the analog pixel signal in a first reading operation. Thereafter, the signal level is read out in a second reading operation. Then, the reset level and the signal level are input to the column AD converting unit 30 through the vertical signal line 13 in time series.

<First Reading>

After first reading from the unit pixel 3 of an arbitrary pixel row to the vertical signal line 13 is stabilized, the reset operation of the comparing unit 31 is performed. In the reference signal generating unit 16, a voltage of one end of the capacitive element Cref is set to $V_{DD}$. Subsequently, the changing unit 18a changes the voltage of the second input terminal of the comparing unit 31 to which the reference signal Ramp is applied to a predetermined voltage having a level higher than the reset level.

<Second Reading>

Subsequently, at the time of second reading, a signal level according to the amount of an incident light of each unit pixel 3 is read out. At the time of the second reading, the reset operation of the comparing unit 31 and the change operation by the changing unit 18a are not performed.

After second reading from the unit pixel 3 of an arbitrary pixel row to the vertical signal line 13 is stabilized, the timing control unit 20 supplies the control data for generating the ramp wave to the reference signal generating unit 16. The reference signal generating unit 16 receives the control data and outputs the reference signal Ramp. The comparing unit 31 compares the voltage of the second input terminal to which the reference signal Ramp from the reference signal generating unit 16 is applied with the voltage of the first input terminal to which the differential signal level is applied, and inverts the comparison output when both of the voltages are substantially equal to each other.

The measuring unit 32 starts measurement in the up-count mode in accordance with the comparison in the comparing unit 31, and holds a measurement value at a point in time at which the comparison output of the comparing unit 31 is inverted. In other words, the measuring unit 32 holds digital data according to a signal component obtained by subtracting the reset level from the signal level ((CDS) process). When a predetermined time elapses, the timing control unit 20 stops the supplying of the control data to the reference signal generating unit 16 and the outputting of the reference clock. As a result, the reference signal generating unit 16 stops the generating of the reference signal Ramp.

Figure 6:
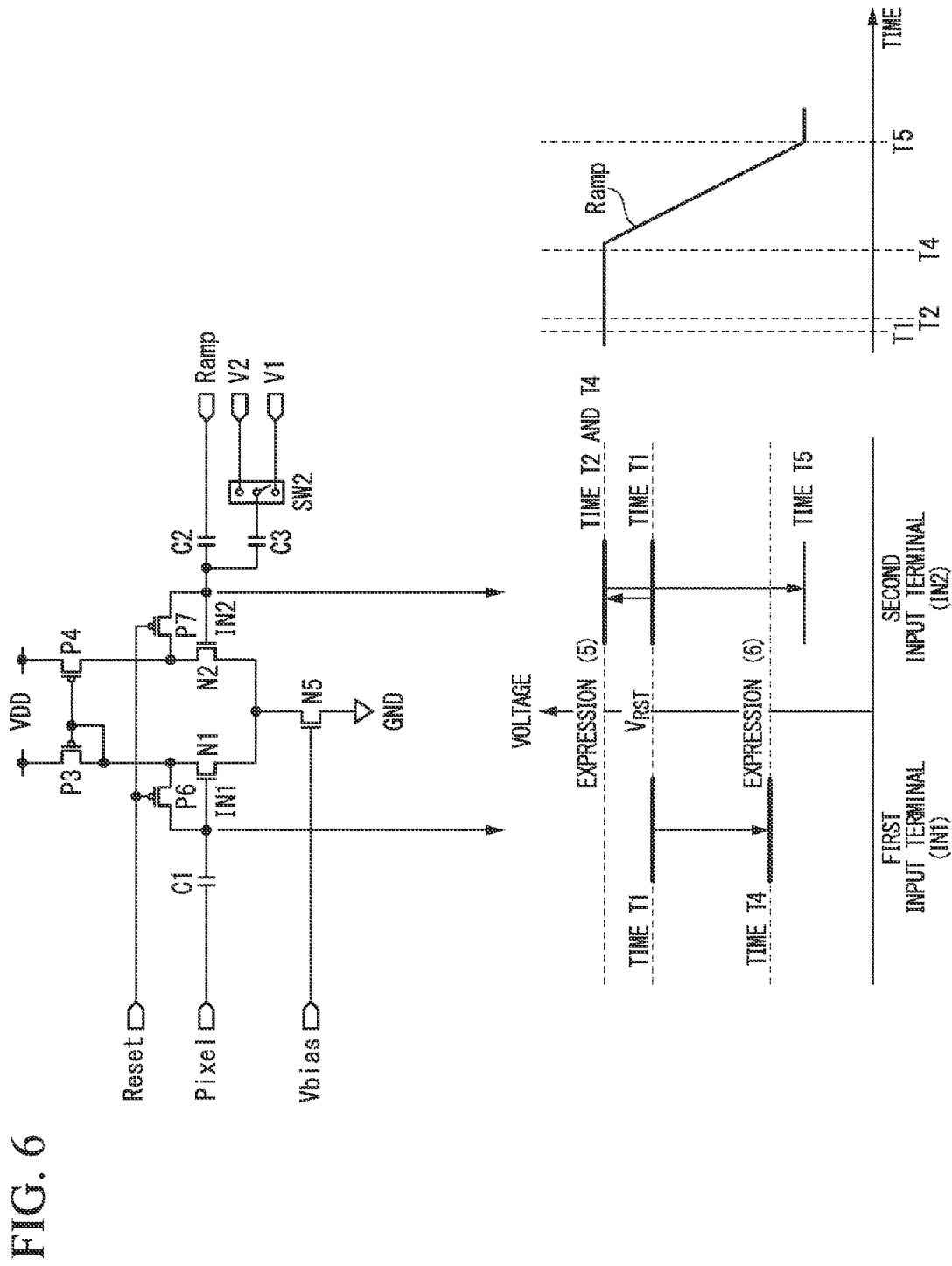
FIG. 6 is a diagram illustrating a configuration of a comparing unit and a changing unit of an imaging device according to a second embodiment of the present invention and a voltage change in the input terminal of the comparing unit.

Next, the details of the voltage change in the input terminal of the comparing unit 31 will be described. FIG. 6 illustrates an example of a concrete circuit configuration of the comparing unit 31 and the changing unit 18a. A circuit configuration illustrated in FIG. 6 is substantially the same as the circuit configuration illustrated in FIG. 5, and thus a description will not be made.

An operation according to the present embodiment will be described below. Here, the voltage of the voltage source V1 is represented by $V_1$, the voltage of the voltage source V2 is represented by $V_2$ (here, $V_1 < V_2$), the voltage of the reset level is represented by $V_R$, the voltage of the signal level is represented by $V_S$ (here, $V_S \leq V_R$), the capacitance value of the capacitive element C2 is represented by $C_2$, and the capacitance value of the capacitive element C3 is represented by $C_3$. FIG. 6 illustrates a voltage change of the first input terminal IN1 and the second input terminal IN2 of the differential amplifier of the comparing unit 31 and the waveform of the reference signal Ramp.

The reset level applied to the first input terminal IN1 as the pixel signal Pixel from the unit pixel 3 and the reference signal Ramp applied from the reference signal generating unit 16 to the second input terminal IN2 are stabilized, and then the reset pulse Reset is activated (low active) before the timing control unit 20 starts a comparison operation of the comparing unit 31. As a result, if the transistors P6 and P7 are turned on, the gate and the drain of the transistor N1 and the gate and the drain of the transistor N2 are short-circuited respectively. Further, the transistors P6 and P7 are reset the voltages of the two their input terminals as the drain voltage using the operation points of the transistors N1 and N2. During the reset operation, the other end of the capacitive element C3 is connected to the voltage source V1 by the switching element SW2.

At the operation point determined by the reset, an offset component between the voltages of the two input terminals of the differential amplifier, that is, an offset component of the gate voltages of the transistors N1 and N2, is almost canceled. In other words, the reset operation is performed so that the voltages of the two input terminals of the differential amplifier become almost the same voltage $V_{RST}$. At this point in time (a time T1), the voltage of the first input terminal IN1 is $V_{RST}$, and the voltage of the second input terminal IN2 is $V_{RST}$. After the reset operation, the transistors P6 and P7 are turned off.

Subsequently, the other end of the capacitive element C3 is connected to the voltage source V2 by the switching element SW2. As a result, the voltage of the second input terminal IN2 to which the reference signal Ramp is applied, i.e., the gate voltage of the transistor N2, is changed higher from the voltage $V_{RST}$ to a predetermined voltage. During the reset operation and the change operation, one end of the capacitive element Cref of the reference signal generating unit 16 remains connected to the power source VDD. The voltage of the other end of the capacitive element C3 changes from $V_1$ to $V_2$ by $(V_2-V_1)$. Thus, at this point in time (a time T2), the voltage $V_{IN2}$ of the second input terminal IN2 is obtained by the following Equation (5).

$$V_{IN2} = V_{RST} + \frac{C_3}{C_2+C_3} \times (V_2 - V_1) \tag{5}$$

Subsequently, the signal level is applied to the first input terminal IN1 as the pixel signal Pixel from the unit pixel 3. The voltage of the other end of the capacitive element C1 to which the reset level is applied as the pixel signal Pixel is $V_R$ at a point in time (a time T2) at which the other end of the capacitive element C3 is connected to the voltage source V2 by the switching element SW2. The voltage of the other end of the capacitive element C1 is $V_S$ at a point in time (a time T4) at which the signal level is input as the pixel signal Pixel. Thus, the voltage $V_{IN1}$ of the first input terminal IN1 at the time T4 is obtained by the following Equation (6). At this point in time (the time T4), one end of the capacitive element Cref of the reference signal generating unit 16 remains connected to the power source VDD.

$$V_{IN1} = V_{RST} + (V_S - V_R) \tag{6}$$

During the second reading, at the time T4, the voltage of the second input terminal IN2 to which the reference signal Ramp is applied is obtained by Equation (5). Since $V_1$ is smaller than $V_2$ in Equation (5) and $V_S$ is smaller than or equal to $V_R$ in Equation (6), the voltage $V_{IN2}$ of Equation (5) is higher than the voltage $V_{IN1}$ of Equation (6). In other words, the voltage of the second input terminal IN2 when the comparing unit 31 starts the comparison operation for the second reading is higher than the voltage of the first input terminal IN1. As illustrated in FIG. 6, the ramp wave that decreases with passage of time is applied as the reference signal Ramp. As a result, the output of the comparing unit 31 is possible to be inverted during the comparison operation reliably, and the comparison operation by the comparing unit 31 is possible to be guaranteed.

After the time T4, one end of the capacitive element Cref of the reference signal generating unit 16 is connected to the constant current source Iref, and the ramp wave is applied to the second input terminal as the reference signal Ramp. The voltage $V_{IN2}$ of the second input terminal IN2 after a point in time at which the ramp wave is applied to the second input terminal is obtained by Equation (7). A third term at the right side of Equation (7) is a component generated as the voltage of the ramp wave changes from $V_{Ramp}(0)(=V_{DD})$ to $V_{Ramp}(t)$ by $(V_{Ramp}(t)-V_{DD})$.

$$V_{IN2} = V_{RST} + \frac{C_3}{C_2+C_3} \times (V_2 - V_1) + \frac{C_3}{C_2+C_3} \times (V_{Ramp}(t) - V_{DD}) \tag{7}$$

The comparison output of the comparing unit 31 is inverted at a timing at which the voltage of the second input terminal that the ramp wave is supplied is substantially equal to the voltage of the first input terminal. The reference signal generating unit 16 stops the generating of the ramp wave at a point in time (a time T5) at which a predetermined time elapses after the ramp wave starts to be input to the second input terminal. The measuring unit 32 performs measurement in the up-count mode when the second reading. Thus, the measurement value related to Equation (6) is obtained as the measurement value of the measuring unit 32.

As described above, according to the present embodiment, after the reset operation by the transistors P6 and P7, the changing unit 18a (the capacitive element C3 and the switching element SW2) changes the voltage of the second input terminal IN2 to a higher voltage such that the voltage difference between the first input terminal IN1 and the second input terminal IN2 is the voltage guaranteeing the comparison operation by the comparing unit 31. Thus, the comparing unit 31 is possible to reliably perform the comparison operation of the reference signal Ramp and the pixel signal Pixel. Further, the voltage of the input terminal of the differential amplifier is changed by performing a predetermined voltage change through the capacitive element C3. The voltage of the input terminal of the differential amplifier does not change to a voltage higher than necessary.

In the present embodiment, digital data is possible to be obtained by a single AD conversion operation. The voltage of the second input terminal to which the reference signal Ramp is applied is changed higher to a predetermined voltage, and thus digital data in which the signal component $(V_S-V_R)$ superimposed the offset component $(V_{RST})$ is obtained. However, the offset component is possible to be suppressed by calculating digital data of the offset component using data of a light-shielding pixel or a dummy pixel disposed in the imaging unit 2 and subtracting the digital data of the offset component from the measurement value of the measuring unit 32.

(Third Embodiment)

Figure 7:
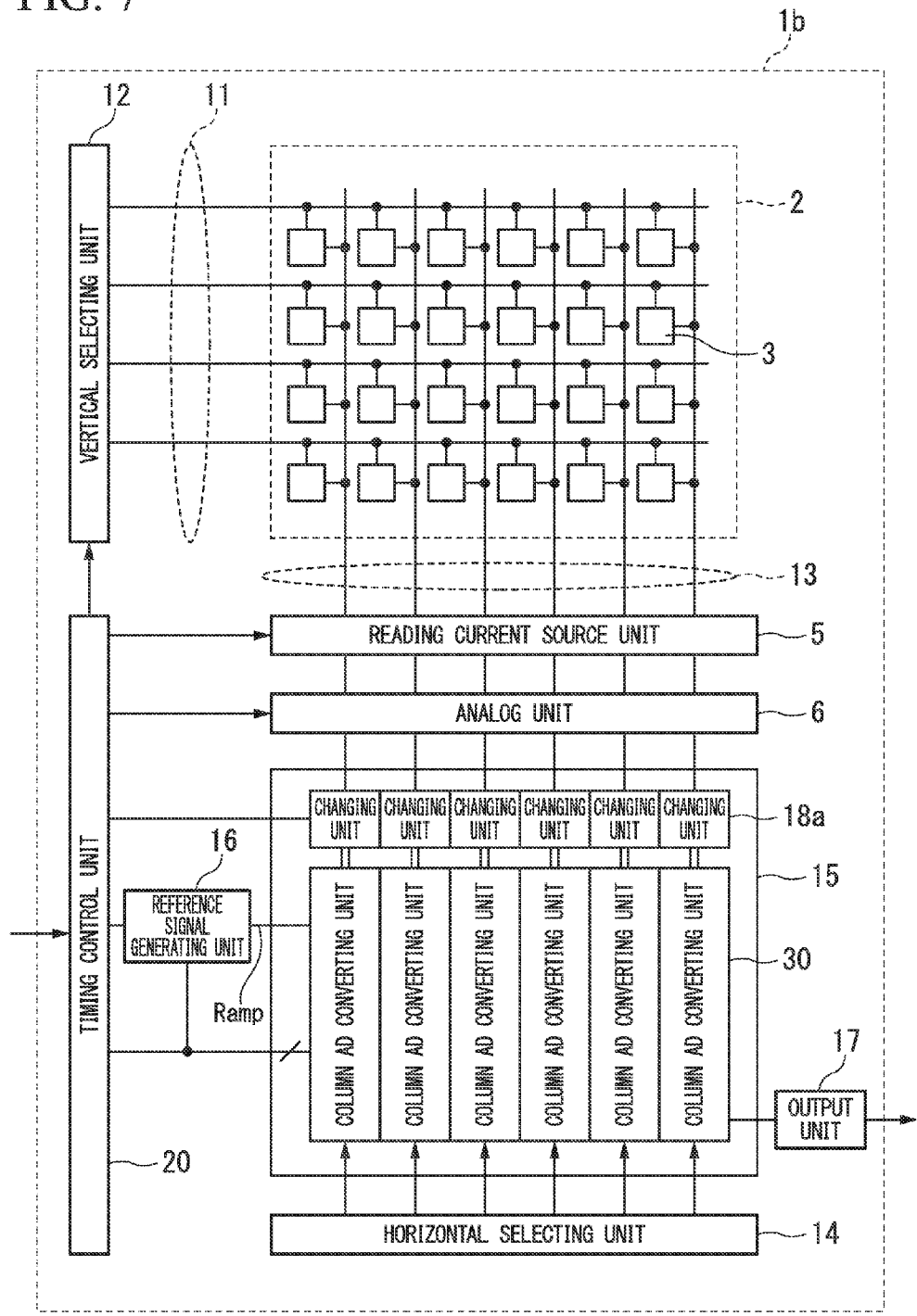
FIG. 7 is a block diagram illustrating a configuration of an imaging device according to a third embodiment of the present invention.

Next, a third embodiment of the present invention will be described. FIG. 7 illustrates an example of a configuration of a (C)MOS imaging device according to the present embodiment. A configuration according to the present embodiment will be described. An imaging device 1b illustrated in FIG. 7 differs from that of FIG. 1 in a configuration of an analog unit 6. The analog unit 6 according to the present embodiment includes a subtracting (CDS processing) circuit. The remaining configuration of the analog unit 6 is similar to the configuration illustrated in FIG. 1 and thus will not be described.

Figure 8:
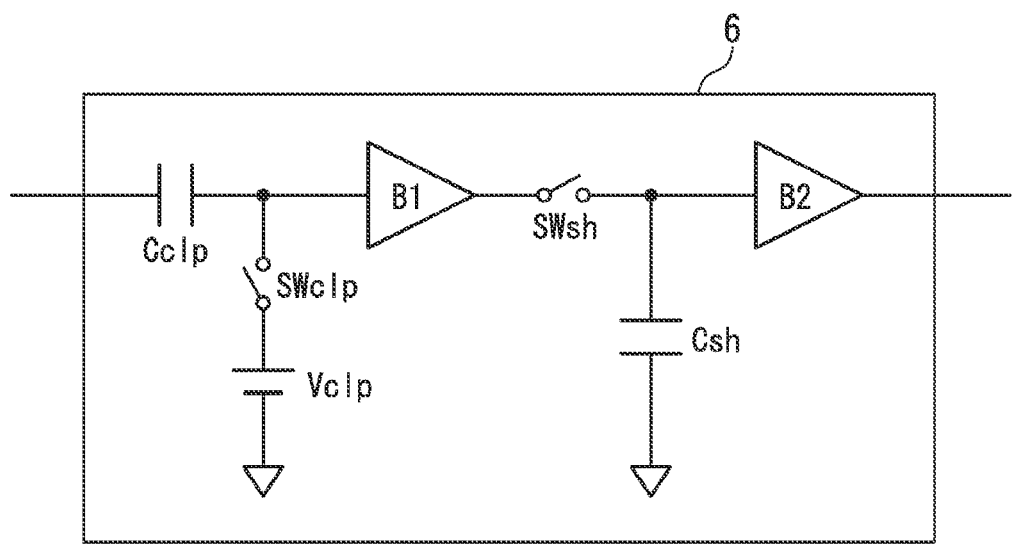
FIG. 8 is a circuit diagram illustrating a configuration of an analog unit of the imaging device according to the third embodiment of the present invention.

FIG. 8 illustrates an example of a configuration of the analog unit 6. The analog unit 6 illustrated in FIG. 8 is configured to include a CDS processing function as a device for acquiring a signal component according to the difference between a first signal voltage and a second signal voltage. The analog unit 6 includes a clamp capacitor Cclp connected to the vertical signal line 13, a clamp switch SWclp for clamping a clamp capacitor Cclp to a clamp bias Vclp, a sample-hold capacitor Csh for sample-holding a signal, a sample-hold switch SWsh, and buffer units B1 and B2. When the CDS process is performed, the analog unit 6 controls the clamp switch SWclp and the sample-hold switch SWsh based on two pulses, that is, a clamp pulse and a sampling pulse applied from the timing control unit 20. The analog unit 6 acquires a signal component by performs a subtraction operation (the CDS process) of the reset level and the signal level on the pixel signal of the voltage mode input through the vertical signal line 13.

Next, an operation according to the present embodiment will be described. Unlike an operation of the imaging device 1a according to the first embodiment, the AD conversion operation is performed by the subtracting (CDS processing) circuit disposed in the analog unit 6. The following description will proceed in connection with a portion of the operation according to the present embodiment which is different from the first embodiment. Similarly to the first embodiment, the unit pixel 3 outputs the reset level and the signal level. Here, the voltage of the reset level is represented by $V_R$, and the voltage of the signal level is represented by $V_S$ (here, $V_S \leq V_R$).

The AD conversion is performed as follows. For example the ramp wave (the reference signal Ramp) that drops with a predetermined inclination is compared with a voltage (a differential signal level) according to the difference between the reset level and the signal level of the pixel signal from the unit pixel 3. A period of time from a point in time at which the ramp wave used in the comparing process is generated to a point in time at which the signal according to the differential signal level matches the ramp wave (the ramp voltage) is measured, for example, using a reference clock. As a result, digital data corresponding to the level of the differential signal level is obtained.

Here, the reset level is read out from each unit pixel 3 of the selected row of the imaging unit 2 as the analog pixel signal in a first reading operation. Thereafter, the signal level is read out in a second reading operation. Then, the reset level and the signal level are input to the analog unit 6 in time series through the vertical signal line 13.

<First Reading>

First reading from the unit pixel 3 of an arbitrary pixel row to the vertical signal line 13 is stabilized. Thereafter, the clamp switch SWclp and the sample-hold switch SWsh is turned on, and the reset operation of the comparing unit 31 is performed. In the reference signal generating unit 16, a voltage of one end of the capacitive element Cref is set to $V_{DD}$. Subsequently, the changing unit 18a changes the voltage of the second input terminal of the comparing unit 31 to which the reference signal Ramp is applied to a predetermined voltage having a level higher than the reset level. Subsequently, the clamp switch SWclp is turned off.

<Second Reading>

Subsequently, at the time of second reading, a signal level according to the amount of an incident light of each unit pixel 3 is read out. At the time of the second reading, the reset operation of the comparing unit 31 and the change operation by the changing unit 18a are not performed. Further, since the clamp switch SWclp is turned off, when the voltage input to the clamp capacitor Cclp changes from the reset level to the signal level, the input voltage of the buffer unit B1 changes by a voltage ($V_S-V_R$) according to the change. With this change, the input voltage and the output voltage of the buffer unit B2 similarly change. As a result, the differential signal level ($V_S-V_R$) between the signal level and the reset level is applied to the first input terminal of the comparing unit 31. After the signal level is read out, the sample-hold switch SWsh is turned off.

Second reading from the unit pixel 3 of an arbitrary pixel row to the vertical signal line 13 is stabilized. Thereafter, the timing control unit 20 supplies the control data for generating the ramp wave to the reference signal generating unit 16. The reference signal generating unit 16 receives the control data and outputs the reference signal Ramp. The comparing unit 31 compares the voltage of the second input terminal to which the reference signal Ramp is applied from the reference signal generating unit 16 with the voltage of the first input terminal to which the differential signal level is applied.

In the present embodiment, similarly to the second embodiment, even when a slight variation remains between the voltages of the two input terminals of the differential amplifier configuring the comparing unit 31 after the reset operation of the comparing unit 31, the voltage of the second input terminal IN2 when the comparing unit 31 starts the comparison operation is higher than the voltage of the first input terminal IN1. Thus, the output of the comparing unit 31 is possible to be inverted during the comparison operation reliably, and the comparison operation by the comparing unit 31 is possible to be guaranteed.

The comparing unit 31 compares the voltage of the second input terminal to which the reference signal Ramp from the reference signal generating unit 16 is applied with the voltage of the first input terminal to which the differential signal level is applied, and inverts the comparison output when both of the voltages are substantially equal to each other. The measuring unit 32 starts measurement in the up-count mode in accordance with start in the comparing unit 31, and holds a measurement value at a point in time at which the comparison output of the comparing unit 31 is inverted. In other words, the measuring unit 32 holds digital data according to a signal component obtained by subtracting the reset level from the signal level (performing a correlated double sampling (CDS) process). When a predetermined time elapses, the timing control unit 20 stops the supplying of the control data to the reference signal generating unit 16 and the outputting of the reference clock. As a result, the reference signal generating unit 16 stops the generating of the reference signal Ramp.

The voltage of the first input terminal IN1 when the comparing unit 31 starts the comparison operation for the second reading is obtained by Equation (8) which is the same as Equation (6) described in the second embodiment. At the time of the second reading, the measuring unit 32 performs measurement in the up-count mode, and thus the measurement value related to Equation (8) is obtained as the measurement value of the measuring unit 32.

$$V_{IN1}=V_{RST}+(V_S-V_R) \quad\quad\quad (8)$$

As described above, according to the present embodiment, after the reset operation by the transistors P6 and P7, the changing unit 18a (the capacitive element C3 and the switching element SW2) changes the voltage of the second input terminal IN2 to a higher voltage such that the voltage difference between the first input terminal IN1 and the second input terminal IN2 is the voltage guaranteeing the comparison operation by the comparing unit 31. Thus, the comparing unit 31 is possible to perform the comparison operation of the reference signal Ramp and the pixel signal Pixel reliably. Further, the voltage of the input terminal of the differential amplifier is changed by performing a predetermined voltage change through the capacitive element C3. The voltage of the input terminal of the differential amplifier does not change to be higher than necessary. As a result, the AD conversion is possible to be performed at a high speed.

In the present embodiment, digital data is possible to be obtained by a single AD conversion operation. The voltage of the second input terminal to which the reference signal Ramp is applied is changed higher to a predetermined voltage, and thus digital data in which the signal component ($V_S$–$V_R$) superimposed the offset component ($V_{RST}$) is obtained However, the offset component is possible to be suppressed by calculating digital data of the offset component using data of a light-shielding pixel or a dummy pixel disposed in the imaging unit 2 and subtracting the digital data of the offset component from the measurement value of the measuring unit 32.

(Fourth Embodiment)

Figure 9:
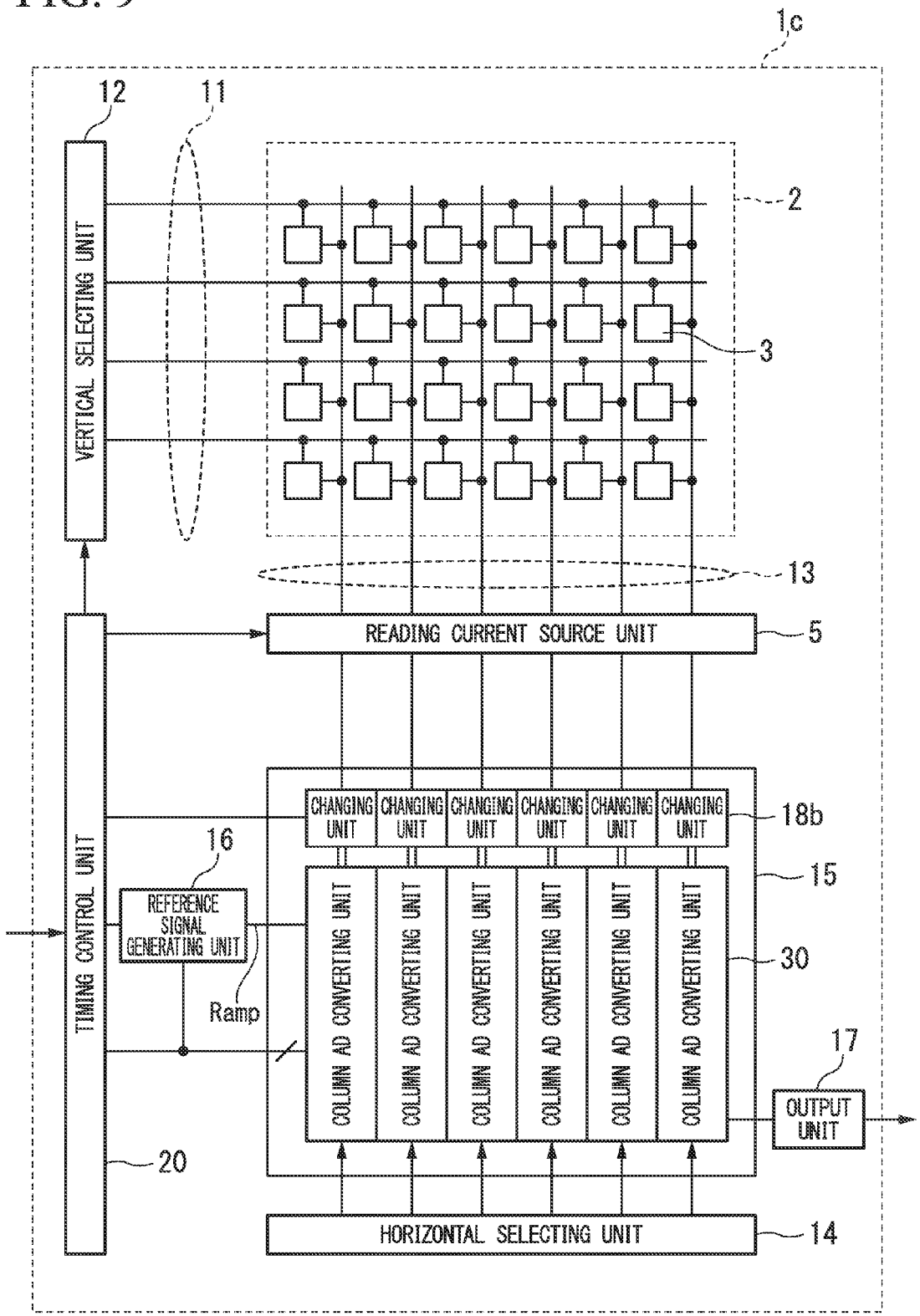
FIG. 9 is a block diagram illustrating a configuration of an imaging device according to a fourth embodiment of the present invention.

Next, a fourth embodiment according to the present invention will be described. FIG. 9 illustrates an example of a configuration of a (C)MOS imaging device according to the present embodiment. A configuration according to the present embodiment will be described. An imaging device 1c illustrated in FIG. 9 differs from that of FIG. 1 in a connection between a changing unit 18b and another portion. Elements configuring the changing unit 18b are the same as those of the changing unit 18a of FIG. 1. The remaining configuration is substantially the same as the configuration illustrated in FIG. 1, and thus a description thereof will not be made.

The following description will proceed in connection with a portion of the operation according to the present embodiment which is different from the first embodiment. Similarly to the first embodiment, the unit pixel 3 outputs the reset level and the signal level.

The AD conversion is performed as follows. For example the ramp wave (the reference signal Ramp) that drops with a predetermined inclination is compared with each voltage of the reset level and the signal level of the pixel signal from the unit pixel 3. A period of time from a point in time at which the ramp wave used in the comparing process is generated to a point in time at which the signal according to the reset level or the signal level matches the ramp wave (the ramp voltage) is measured, for example, using a reference clock. As a result, digital data corresponding to each level of the reset level or the signal level is obtained.

Here, the reset level including noise of the pixel signal is read out from each unit pixel 3 of the selected row of the imaging unit 2 as the analog pixel signal in a first reading operation. Thereafter, the signal level is read out in a second reading operation. Then, the reset level and the signal level are input to the column AD converting unit 30 through the vertical signal line 13 in time series.

<First Reading>

After first reading from the unit pixel 3 of an arbitrary pixel row to the vertical signal line 13 is stabilized, the reset operation of the comparing unit 31 is performed. In the reference signal generating unit 16, a voltage of one end of the capacitive element Cref is set to $V_{DD}$.

Subsequently, the changing unit 18b changes the voltage of the second input terminal to which the reference signal Ramp is applied of the comparing unit 31 to a predetermined voltage having a level higher than the reset level. Thereafter, the timing control unit 20 supplies the control data for generating the ramp wave to the reference signal generating unit 16. The reference signal generating unit 16 receives the control data, and outputs the reference signal Ramp whose waveform changes over time in a ramp form as a whole as a comparison voltage applied to the second input terminal of the comparing unit 31. The comparing unit 31 compares the voltage of the second input terminal to which the reference signal Ramp from the reference signal generating unit 16 is applied with the voltage of the first input terminal to which the reset level is applied, and inverts the comparison output when the two voltages are substantially equal to each other.

The measuring unit 32 starts measurement in the down-count mode in accordance with start of the comparison in the comparing unit 31, and holds a measurement value at a point in time at which the comparison output of the comparing unit 31 is inverted. In other words, the measuring unit 32 holds the digital data according to the reset level. When a predetermined time elapses, the timing control unit 20 stops supplying the control data to the reference signal generating unit 16 and outputting the reference clock. As a result, the reference signal generating unit 16 stops generating the reference signal Ramp.

<Second Reading>

Subsequently, at the time of second reading, a signal level according to the amount of an incident light of each unit pixel 3 is read out. At the time of second reading, the reset operation of the comparing unit 31 and the change operation by the changing unit 18b are not performed. In the reference signal generating unit 16, a voltage of one end of the capacitive element Cref is set to $V_{DD}$.

After second reading from the unit pixel 3 of an arbitrary pixel row to the vertical signal line 13 is stabilized, the timing control unit 20 supplies the control data for generating the ramp wave to the reference signal generating unit 16. The reference signal generating unit 16 receives the control data and outputs the reference signal Ramp. The comparing unit 31 compares the voltage of the second input terminal to which the reference signal Ramp from the reference signal generating unit 16 is applied with the voltage of the first input terminal to which the signal level is applied, and inverts the comparison output when the two voltages are substantially equal to each other.

The measuring unit 32 starts measurement in the up-count mode in accordance with start of the comparison in the comparing unit 31, and holds a measurement value at a point in time at which the comparison output of the comparing unit 31 is inverted. In other words, the measuring unit 32 holds digital data according to a signal component obtained by subtracting the reset level from the signal level ((CDS) process). When a predetermined time elapses, the timing control unit 20 stops supplying the control data to the reference signal generating unit 16 and outputting the reference clock. As a result, the reference signal generating unit 16 stops generating the reference signal Ramp.

Figure 10:
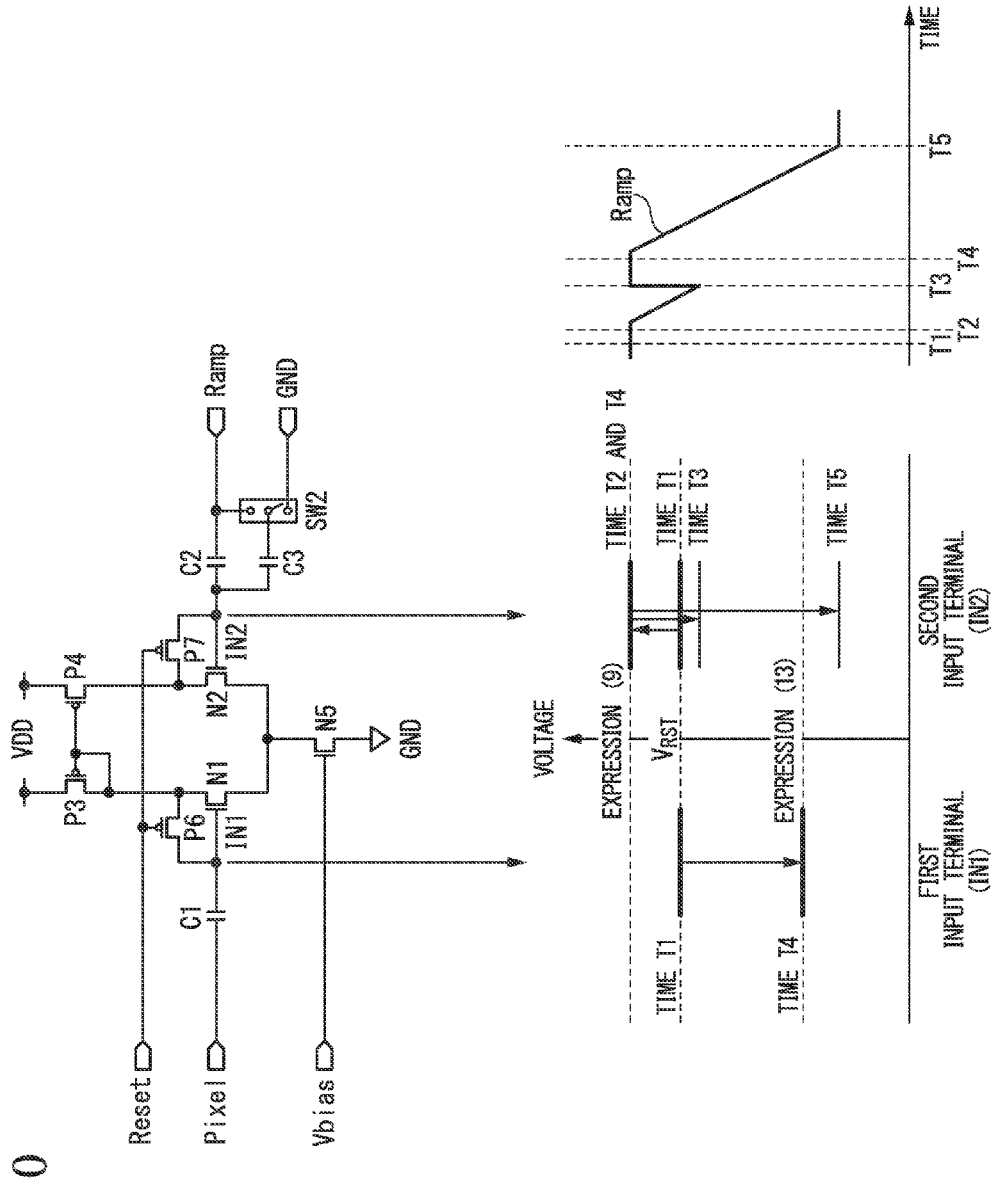
FIG. 10 is a diagram illustrating a configuration of a comparing unit and a changing unit of the imaging device according to the fourth embodiment of the present invention and a voltage change in an input terminal of the comparing unit.

Next, the details of configurations of the comparing unit 31 and the changing unit 18b and a voltage change in the input terminal of the comparing unit 31 will be described. FIG. 10 illustrates an example of a concrete circuit configuration of the comparing unit 31 and the changing unit 18b.

A circuit configuration of the present embodiment will be described below. The following description will proceed in a configuration different from the configuration illustrated in FIG. 5.

The changing unit 18b configured with a switching element SW2 and a capacitive element C3, similarly to the changing unit 18a as previously described. However, a connection in the switching element SW2 differs from the changing unit 18a. A first terminal of the switching element SW2 is connected to the other end of the capacitive element C3. A second terminal of the switching element SW2 is connected to the ground GND, and a third terminal of the switching element SW2 is connected to the other end of the capacitive element C2 to which the reference signal Ramp is input. The second terminal of the switching element SW2 may be connected to a voltage source that supplies a predetermined voltage rather than the ground GND. The switching element SW2 performs switching between a state in which the first terminal and the second terminal are short-circuited to each other and therefore the ground GND is connected to the other end of the capacitive element C3 and a state in which the first terminal and the third terminal are short-circuited to each other and therefore the other end of the capacitive element C2 is connected to the other end of the capacitive element C3.

An operation according to the present embodiment will be described below. Here, the voltage of the ground GND is represented by $V_{GND}$, the voltage of the reset level is represented by $V_R$, the voltage of the signal level is represented by $V_S$ (here, $V_S \le V_R$), the capacitance value of the capacitive element C2 is represented by $C_2$, and the capacitance value of the capacitive element C3 is represented by $C_3$. FIG. 10 illustrates a voltage change of the first input terminal IN1 and the second input terminal IN2 of the differential amplifier of the comparing unit 31 and the waveform of the reference signal Ramp.

The reset level is applied to the first input terminal IN1 as the pixel signal Pixel from the unit pixel 3, and the reference signal Ramp applied from the reference signal generating unit 16 to the second input terminal IN2 is stabilized. Thereafter, the reset pulse Reset is activated (low active) before the timing control unit 20 causes the comparing unit 31 to start a comparison operation. As a result, the transistors P6 and 27 are turned on to cause the gate and the drain of the transistor N1 and the gate and the drain of the transistor N2 to be short-circuited respectively, and the voltages of the two input terminals are reset using the drain voltage as the operation points of the transistors N1 and N2. During the reset operation, the other end of the capacitive element C3 remains connected to the ground GND by the switching element SW2.

At the operation point determined by the reset, an offset component between the voltages of the two input terminals of the differential amplifier, that is, an offset component of the gate voltages of the transistors N1 and N2, is almost canceled. In other words, the reset operation is performed so that the voltages of the two input terminals of the differential amplifier become almost the same voltage $V_{RST}$. At this point in time (a time T1), the voltage of the first input terminal IN1 is $V_{RST}$, and the voltage of the second input terminal IN2 is $V_{RST}$. After the reset operation, the transistors P6 and P7 are turned off.

Subsequently, the switching element SW2 connects the other end of the capacitive element C3 to the other end of the capacitive element C2. As a result, the voltage of the second input terminal IN2 to which the reference signal Ramp is applied, i.e., the gate voltage of the transistor N2, is changed higher from the voltage $V_{RST}$ to a predetermined voltage. During the reset operation and the change operation, one end of the capacitive element Cref of the reference signal generating unit 16 remains connected to the power source VDD. Since the voltage of the other end of the capacitive element C3 changes from $V_{GND}$ to $V_{DD}$ by ($V_{DD}-V_{GND}$), at this point in time (a time T2), the voltage $V_{IN2}$ of the second input terminal IN2 is obtained by the following Equation (9).

$$V_{IN2} = V_{RST} + \frac{C_3}{C_2 + C_3} \times (V_{DD} - V_{GND}) \tag{9}$$

Even when a slight variation remains between the voltages of the two input terminals of the differential amplifier configuring the comparing unit 31 after the reset operation of the comparing unit 31, $V_{GND}$ is smaller than $V_{DD}$. Thus, the voltage (Equation (9)) of the second input terminal IN2 when the comparing unit 31 starts the comparison operation in the first reading is higher than the voltage ($V_{RST}$) of the first input terminal IN1. As illustrated in FIG. 10, as the ramp wave that decreases over time is applied as the reference signal Ramp, the output of the comparing unit 31 is possible to be inverted during the comparison operation reliably, and the comparison operation by the comparing unit 31 is possible to be guaranteed.

Figure 11:
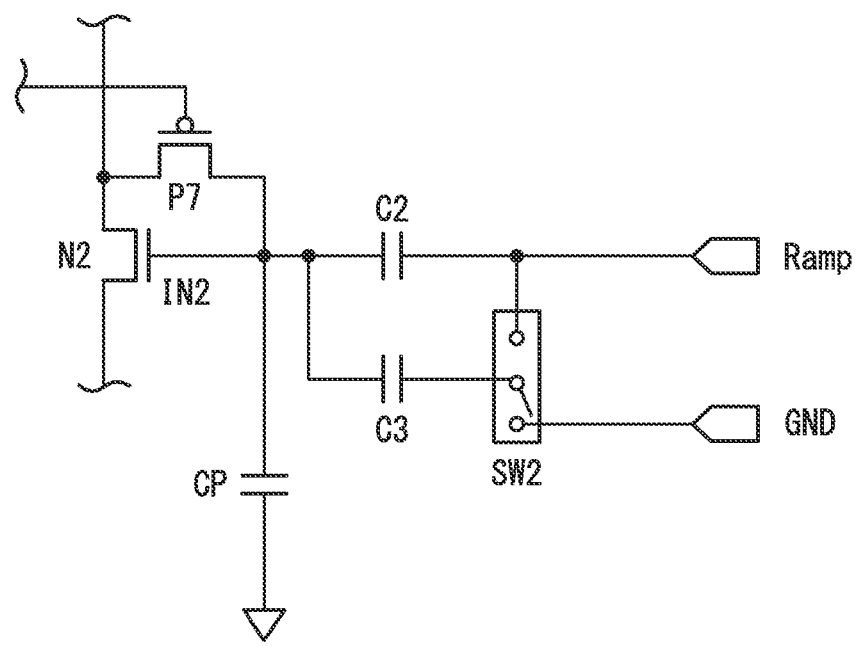
FIG. 11 is a diagram for describing a voltage change in the input terminal of the comparing unit of the imaging device according to the fourth embodiment of the present invention.

After the time T2, one end of the capacitive element Cref of the reference signal generating unit 16 is connected to the constant current source Iref, and the ramp wave is applied to the second input terminal as the reference signal Ramp. Next, the voltage of the second input terminal IN2 to which the reference signal Ramp is applied will be described with reference to FIG. 11. FIG. 11 selectively illustrates a configuration around the second input terminal IN2. The following description will proceed under the assumption of a parasitic capacitor CP between the second input terminal IN2 and the ground GND.

When a change in the voltage of the other end of the capacitive element C2 in case that the voltage of the ramp wave applied to the other end of the capacitive element C2 has changed from $V_{Ramp}(0)$ ($=V_{DD}$) to $V_{Ramp}(t)$ by ($V_{Ramp}(t)-V_{DD}$) is represented by $\Delta V1$, $\Delta V1$ is obtained by the following Equation (10).

$$\Delta V1 = V_{Ramp}(t) - V_{DD} \tag{10}$$

When the transistor P7 is turned off, the other ends of the capacitive elements C2 and C3 are separated from the ground GND, and thus a charge quantity accumulated in the capacitive element C2 and the parasitic capacitor CP is held. Thus, when a change in the voltage of the second input terminal IN2 in case that the voltage of the ramp wave applied to the other end of the capacitive element C2 has changed from $V_{Ramp}(0)$ ($=V_{DD}$) to $V_{Ramp}(t)$ by ($V_{Ramp}(t)-V_{DD}$) is represented by $\Delta V2$, $\Delta V2$ is obtained by the following Equation (11). Here, the capacitive element C2 and the capacitive element C3 are connected to each other in parallel, and a capacitance value combined the capacitive element C1 with the capacitive element C3 which is connected to each other in parallel are combined with each other is $C_C$ in Equation (11). Further, in Equation (11), $C_P$ is a capacitance value of the parasitic capacitor CP.

$$\Delta V2 = \frac{C_C}{C_C + C_P} \times \Delta V1 \tag{11}$$

When $C_P$ is negligible compared to $C_C$ ($C_C \gg C_P$), $\Delta V2$ is equal to $\Delta V1$. The voltage of the second input terminal IN2 before the ramp wave is applied is obtained by Equation (9). Thus, the voltage $V_{IN2}$ of the second input terminal IN2 after the other end of the capacitive element C3 is connected to the other end of the capacitive element C2 by the switching element SW2 is obtained by the following Equation (12).

$$\begin{aligned} V_{IN2} &= V_{RST} + \frac{C_3}{C_2 + C_3} \times (V_{DD} - V_{GND}) + \Delta V2 \\ &= V_{RST} + \frac{C_3}{C_2 + C_3} \times (V_{DD} - V_{GND}) + \Delta V1 \\ &= V_{RST} + \frac{C_3}{C_2 + C_3} \times (V_{DD} - V_{GND}) + \\ &\quad (V_{Ramp}(t) - V_{DD}) \end{aligned} \tag{12}$$

The comparison output of the comparing unit 31 is inverted at a timing at which the voltage of the second input terminal that the ramp wave is supplied is substantially equal to the voltage of the reset first input terminal. The reference signal generating unit 16 stops generating the ramp wave at a point in time (a time T3) at which a predetermined time elapses after the ramp wave starts to be input to the second input terminal.

Subsequently, the signal level is applied to the first input terminal IN1 as the pixel signal Pixel from the unit pixel 3. The voltage of the other end of the capacitive element C1 to which the reset level is applied as the pixel signal Pixel at a point in time (a time T2) at which the other end of the capacitive element C3 is connected to the other end of the capacitive element C2 by the switching element SW2 is $V_R$. The voltage of the other end of the capacitive element C1 is $V_S$ at a point in time (a time T4) at which the signal level is input as the pixel signal Pixel. Thus, the voltage $V_{IN1}$ of the first input terminal IN1 at a time T4 is obtained by the following Equation (13). At this point in time (the time T4), one end of the capacitive element Cref of the reference signal generating unit 16 remains connected to the power source VDD.

$$V_{IN1} = V_{RST} + (V_S - V_R) \tag{13}$$

At the time T4 in the second reading, the voltage of the second input terminal IN2 to which the reference signal Ramp is applied is obtained by Equation (9). Since $V_{GND}$ is smaller than $V_{DD}$ in Equation (9) and $V_S$ is smaller than or equal to $V_R$ in Equation (13), the voltage $V_{IN2}$ of Equation (9) is higher than the voltage $V_{IN1}$ in Equation (13). In other words, the voltage of the second input terminal IN2 when the comparing unit 31 starts the comparison operation in the second reading is higher than the voltage of the first input terminal IN1. As illustrated in FIG. 10, the ramp wave that decreases with passage of time is applied as the reference signal Ramp, and thus the output of the comparing unit 31 is possible to be inverted during the comparison operation reliably, and the comparison operation by the comparing unit 31 is possible to be guaranteed.

After the time T4, one end of the capacitive element Cref of the reference signal generating unit 16 is connected to the constant current source Iref, and the ramp wave is applied to the second input terminal as the reference signal Ramp. The voltage $V_{IN2}$ of the second input terminal IN2 after a point in time at which the ramp wave is applied to the second input terminal is obtained by Equation (12). The comparison output of the comparing unit 31 is inverted at a timing at which the voltage of the second input terminal of the ramp wave is substantially equal to the voltage of the first input terminal. The reference signal generating unit 16 stops the generating of the ramp wave at a point in time (a time T5) at which a predetermined time elapses after the ramp wave starts to be input to the second input terminal. The measuring unit 32 performs measurement in the down-count mode when the first reading, and the measuring unit 32 performs measurement in the up-count mode when the second reading. Thus, the measurement value related to the second term ($V_S - V_R$) on the right side of Equation (13) is obtained as the measurement value of the measuring unit 32.

As described above, according to the present embodiment, the changing unit 18b (the capacitive element C3 and the switching element SW2) changes the voltage of the second input terminal IN2 to a higher voltage so that the voltage difference between the first input terminal IN1 and the second input terminal IN2 is a voltage guaranteeing the comparison operation by the comparing unit 31 after the reset operation by the transistors P6 and P7. Thus, the comparing unit 31 is possible to perform the comparison operation of the reference signal Ramp and the pixel signal Pixel reliably. Further, the voltage of the input terminal of the differential amplifier is changed by performing a predetermined voltage change through the capacitive element C3. The voltage of the input terminal of the differential amplifier does not change to be higher than necessary. As a result, the AD conversion is possible to be performed at a high speed.

In addition, when the coefficient of ($V_{Ramp}(t) - V_{DD}$) of the third term on the right side of Equation (3) in the first embodiment is compared to the coefficient of ($V_{Ramp}(t) - V_{DD}$) of the third term on the right side of Equation (12) in present embodiment, the coefficient in Equation (3) is smaller than 1, and the coefficient in Equation (12) is 1. Thus, in the present embodiment, the AD conversion operation that does not undergo gain reduction resulting from the arrangement of the capacitive element is possible to be performed.

(Fifth Embodiment)

Figure 12:
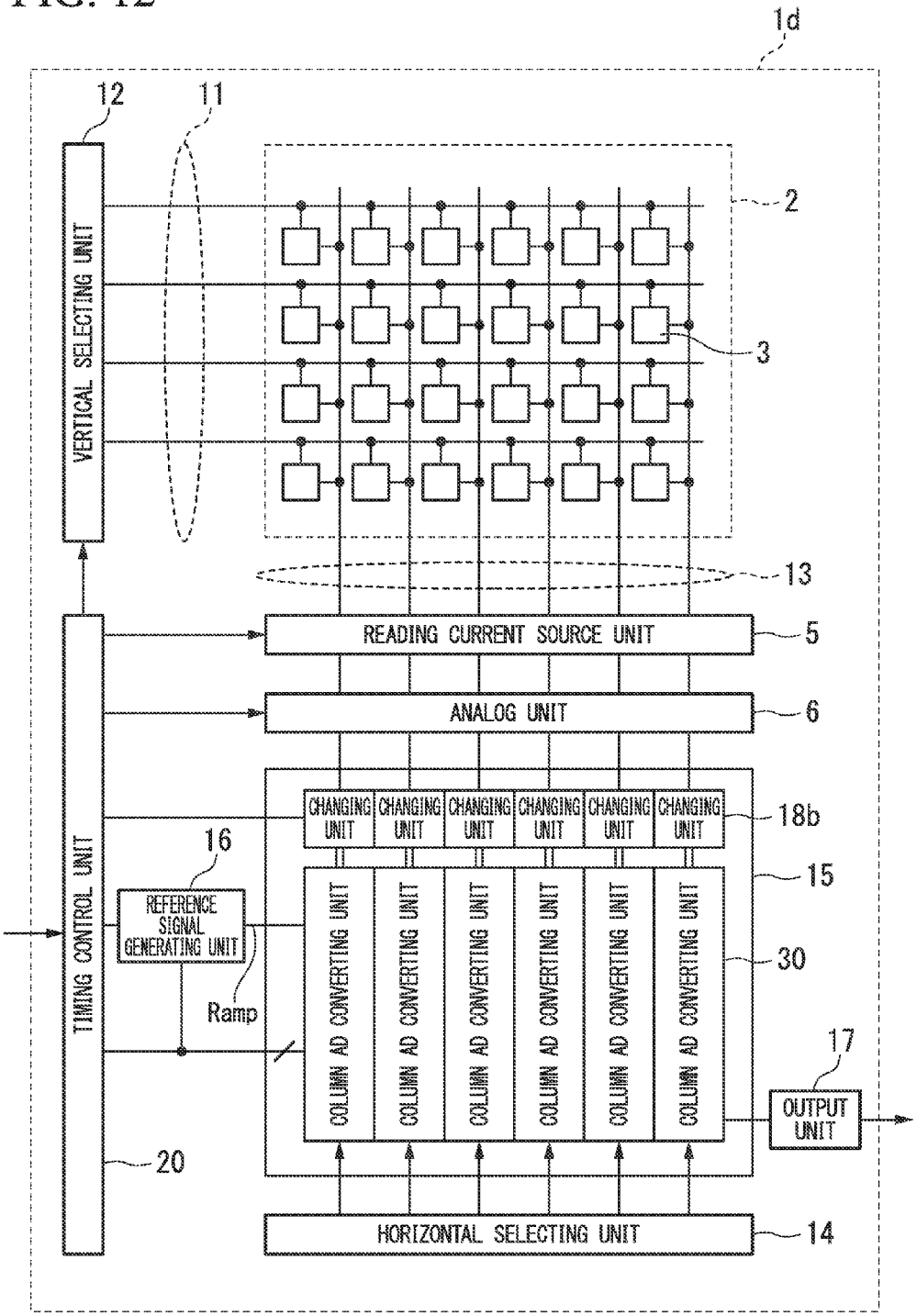
FIG. 12 is a block diagram illustrating a configuration of an imaging device according to the fifth embodiment of the present invention.

Next, a fifth embodiment of the present invention will be described. FIG. 12 illustrates an example of a configuration of a (C)MOS imaging device according to the present embodiment. A configuration according to the present embodiment will be described below. An imaging device 1d illustrated in FIG. 12 differs in a configuration of an analog unit 6 from that illustrated in FIG. 9. The analog unit 6 according to the present embodiment includes a subtracting (CDS process) circuit. The remaining configuration excluding the analog unit 6 is similar to the configuration illustrated in FIG. 9, and thus a description thereof will not be made.

Next, an operation according to the present embodiment will be described. The operation according to the fifth embodiment differs from the operation of the imaging device 1c according to the fourth embodiment in an AD conversion operation in that the subtracting (CDS processing) circuit) is disposed in the analog unit 6. The following description will proceed in connection with a portion of the operation according to the present embodiment which is different from the fourth embodiment. Similarly to the first embodiment, the unit pixel 3 outputs the reset level and the signal level.

The AD conversion is performed as follows. For example the ramp wave (the reference signal Ramp) that drops with a predetermined inclination is compared with a voltage (a differential signal level) according to the difference between the reset level and the signal level of the pixel signal from the unit pixel 3. A period of time from a point in time at which the ramp wave used in the comparing process is generated to a point in time at which the signal according to the differential signal level matches the ramp wave (the ramp voltage) is measured, for example, using a reference clock, and thus digital data according to the value of the differential signal level is obtained.

Here, the reset level is read out from each unit pixel 3 of the selected row of the imaging unit 2 as the analog pixel signal in a first reading operation. Thereafter, the signal level is read out in a second reading operation. Then, the reset level and the signal level are input to the analog unit 6 in time series through the vertical signal line 13.

<First Reading>

After first reading from the unit pixel 3 of an arbitrary pixel row to the vertical signal line 13 is stabilized, the clamp switch SWclp and the sample-hold switch SWsh are turned on, and the reset operation of the comparing unit 31 is performed. In the reference signal generating unit 16, a voltage of one end of the capacitive element Cref is set to $V_{DD}$. Subsequently, the changing unit 18b changes the voltage of the second input terminal to which the reference signal Ramp is applied of the comparing unit 31 to a predetermined voltage having a level higher than the reset level. Subsequently, the clamp switch SWclp is turned off.

<Second Reading>

Subsequently, at the time of second reading, a signal level according to the amount of an incident light of each unit pixel 3 is read out. At the time of the second reading, the reset operation of the comparing unit 31 and the change operation by the changing unit 18b are not performed. Further, the clamp switch SWclp is turned off. For this reason, when the voltage input to the clamp capacitor Cclp changes from the reset level to the signal level, the input voltage of the buffer unit B1 changes by a voltage ($V_S$–$V_R$) with that change. With this change, the input voltage and the output voltage of the buffer unit B2 similarly change. As a result, a differential signal level ($V_S$–$V_R$) between the signal level and the reset level is applied to the first input terminal of the comparing unit 31. After the signal level is read out, the sample-hold switch SWsh is turned off.

After second reading from the unit pixel 3 of an arbitrary pixel row to the vertical signal line 13 is stabilized, the timing control unit 20 supplies the control data for generating the ramp wave to the reference signal generating unit 16. The reference signal generating unit 16 receives the control data and outputs the reference signal Ramp. The comparing unit 31 compares the voltage of the second input terminal to which the reference signal Ramp is applied from the reference signal generating unit 16 with the voltage of the first input terminal to which the differential signal level is applied.

In the present embodiment, similarly to the second embodiment, even when a slight variation remains between the voltages of the two input terminals of the differential amplifier configuring the comparing unit 31 after the reset operation of the comparing unit 31, the voltage of the second input terminal IN2 when the comparing unit 31 starts the comparison operation is higher than the voltage of the first input terminal IN1. Thus, the output of the comparing unit 31 is possible to be reliably inverted during the comparison operation, and the comparison operation by the comparing unit 31 is possible to be guaranteed.

The comparing unit 31 compares the voltage of the second input terminal to which the reference signal Ramp from the reference signal generating unit 16 is applied with the voltage of the first input terminal to which the differential signal level is applied, and inverts the comparison output when both of the voltages are equal to each other. The measuring unit 32 starts measurement in the up-count mode based on the comparison start of the comparing unit 31, and holds a measurement value at a point in time at which the comparison output of the comparing unit 31 is inverted.

In other words, the measuring unit 32 holds digital data according to a signal component obtained by subtracting the reset level from the signal level ((CDS) process). When a predetermined time elapses, the timing control unit 20 stops the supplying of the control data to the reference signal generating unit 16 and the outputting of the reference clock. As a result, the reference signal generating unit 16 stops the generating of the reference signal Ramp.

Figure 13:
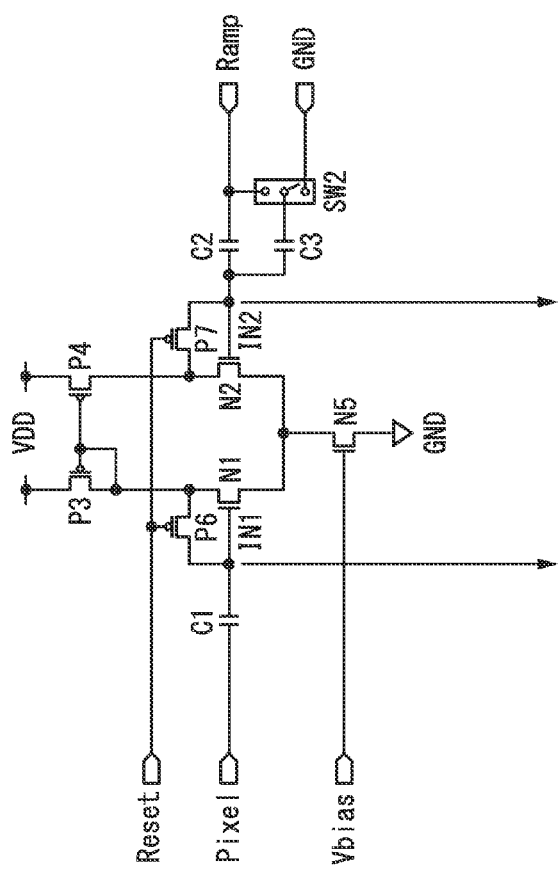
FIG. 13 is a diagram illustrating a configuration of a comparing unit and a changing unit of the imaging device according to the fifth embodiment of the present invention and a voltage change in an input terminal of the comparing unit.
Figure 13:
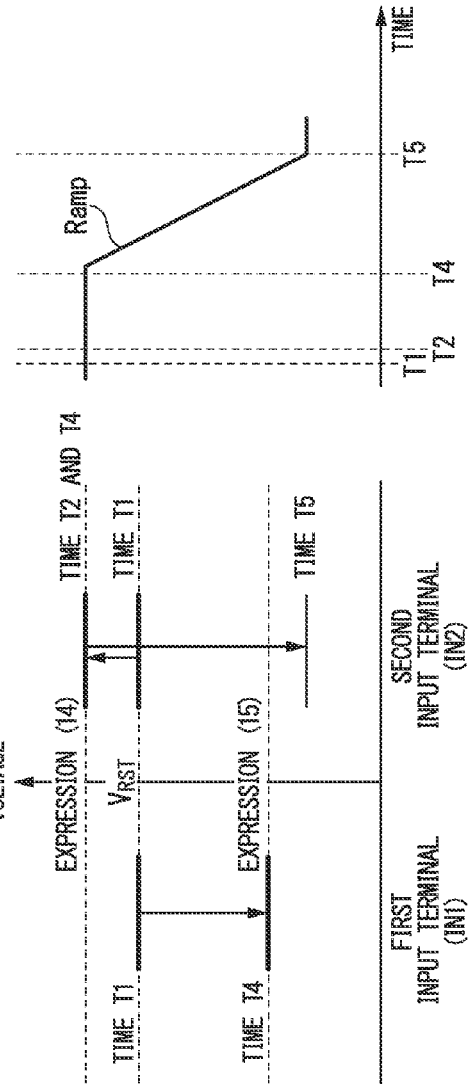

Next, the details of the voltage change in the input terminal of the comparing unit 31 will be described. FIG. 13 illustrates an example of a concrete circuit configuration of the comparing unit 31 and the changing unit 18b. The circuit configuration illustrated in FIG. 13 is similar to the circuit configuration illustrated in FIG. 10, and thus a description thereof will not be made.

An operation according to the present embodiment will be described below. Here, the voltage of the ground GND is represented by $V_{GND}$, the voltage of the reset level is represented by $V_R$, the voltage of the signal level is represented by $V_S$ (here, $V_S \le V_R$), the capacitance value of the capacitive element C2 is represented by $C_2$, and the capacitance value of the capacitive element C3 is represented by $C_3$. FIG. 13 illustrates a voltage change of the first input terminal IN1 and the second input terminal IN2 of the differential amplifier of the comparing unit 31 and the waveform of the reference signal Ramp.

The reset level applied to the first input terminal IN1 as the pixel signal Pixel from the unit pixel 3 and the reference signal Ramp applied from the reference signal generating unit 16 to the second input terminal IN2 are stabilized. Thereafter, the timing control unit 20 activates (low active) to reset the reset pulse before starting a comparison operation in the comparing unit 31. As a result, the transistors P6 and P7 are turned on to cause the gate and the drain of the transistor N1 and the gates and the drains of the transistor N2 to be short-circuited respectively, and the voltages of the two input terminals are reset using the drain voltage as the operation points of the transistors N1 and N2. During the reset operation, the other end of the capacitive element C3 remains connected to the ground GND by the switching element SW2.

At the operation point determined by the reset, an offset component between the voltages of the two input terminals of the differential amplifier, that is, an offset component of the gate voltages of the transistors N1 and N2, is almost canceled. In other words, the reset operation is performed so that the voltages of the two input terminals of the differential amplifier become almost the same voltage $V_{RST}$. At this point in time (a time T1), the voltage of the first input terminal IN1 is $V_{RST}$, and the voltage of the second input terminal IN2 is $V_{RST}$. After the reset operation, the transistors P6 and P7 are turned off.

Subsequently, the switching element SW2 connects the other end of the capacitive element C3 to the other end of the capacitive element C2, and thus the voltage of the second input terminal IN2 to which the reference signal Ramp is applied, i.e., the gate voltage of the transistor N2, changes from the voltage $V_{RST}$ to a predetermined high voltage. During the reset operation and the change operation, one end of the capacitive element Cref of the reference signal generating unit 16 remains connected to the power source VDD. Since the voltage of the other end of the capacitive element C3 changes from $V_{GND}$ to $V_{DD}$ by ($V_{DD}$–$V_{GND}$), the voltage $V_{IN2}$ of the second input terminal IN2 is obtained by the following Equation (14) at this point in time (a time T2).

$$V_{IN2} = V_{RST} + \frac{C_3}{C_2 + C_3} \times (V_{DD} - V_{GND}) \qquad (14)$$

Subsequently, the signal level is applied to the first input terminal IN1 as the pixel signal Pixel from the unit pixel 3. The voltage of the other end of the capacitive element C1 to which the reset level is applied as the pixel signal Pixel at a point in time (a time T2) at which the other end of the capacitive element C3 is connected to the other end of the capacitive element C2 by the switching element SW2 is $V_R$. The voltage of the other end of the capacitive element C1 is $V_S$ at a point in time (a time T4) at which the signal level is input as the pixel signal Pixel. Thus, the voltage $V_{IN1}$ of the first input terminal IN1 at a time T4 is obtained by the following Equation (15). At this point in time (the time T4), one end of the capacitive element Cref of the reference signal generating unit 16 remains connected to the power source VDD.

$$V_{IN1} = V_{RST} + (V_S - V_R) \qquad (15)$$

At the time T4 in the second reading, the voltage of the second input terminal IN2 to which the reference signal Ramp is applied is obtained by Equation (14). Since $V_{GND}$ is smaller than $V_{DD}$ in Equation (14) and $V_S$ is smaller than or equal to $V_R$ in Equation (15), the voltage $V_{IN2}$ of Equation (14) is higher than the voltage $V_{IN1}$ in Equation (15). That is, the voltage of the second input terminal IN2 when the comparing unit 31 starts the comparison operation for the second reading is higher than the voltage of the first input terminal IN1. As illustrated in FIG. 13, the ramp wave that decreases with passage of time is applied as the reference signal Ramp, and thus the output of the comparing unit 31 is possible to be inverted during the comparison operation reliably, and the comparison operation by the comparing unit 31 is possible to be guaranteed.

After the time T4, one end of the capacitive element Cref of the reference signal generating unit 16 is connected to the constant current source fret; and the ramp wave is applied to the second input terminal as the reference signal Ramp. The voltage $V_{IN2}$ of the second input terminal IN2 after a point in time at which the ramp wave is applied to the second input terminal is obtained by the following Equation (16) which is the same as Equation (12) described in the fourth embodiment.

$$V_{IN2} = V_{RST} + \frac{C_3}{C_2 + C_3} \times (V_{DD} - V_{GND}) + (V_{Ramp}(t) - V_{DD}) \quad (16)$$

The comparison output of the comparing unit 31 is inverted at a timing at which the voltage of the second input terminal of the ramp wave is substantially equal to the voltage of the first input terminal. The reference signal generating unit 16 stops generating the ramp wave at a point in time (a time T5) at which a predetermined time elapses after the ramp wave starts to be input to the second input terminal.

The comparison output of the comparing unit 31 is inverted at a timing at which the voltage of the second input terminal that the ramp wave is supplied is substantially equal to the voltage of the first input terminal. The reference signal generating unit 16 stops generating the ramp wave at a point in time (a time T5) at which a predetermined time elapses after the ramp wave starts to be input to the second input terminal. At the time of the second reading, the measuring unit 32 performs measurement in the up-count mode, and thus the measurement value related to Equation (15) is obtained as the measurement value of the measuring unit 32.

As described above, according to the present embodiment, the changing unit 18b (the capacitive element C3 and the switching element SW2) changes the voltage of the second input terminal IN2 to a higher voltage so that the voltage difference between the first input terminal IN1 and the second input terminal IN2 is a voltage guaranteeing the comparison operation by the comparing unit 31 after the reset operation by the transistors P6 and P7. Thus, the comparing unit 31 is possible to perform the comparison operation of the reference signal Ramp and the pixel signal Pixel reliably. Further, the voltage of the input terminal of the differential amplifier is changed by performing a predetermined voltage change through the capacitive element C3. The voltage of the input terminal of the differential amplifier does not change to be higher than necessary. As a result, the AD conversion is possible to be performed at a high speed.

In the present embodiment, digital data is possible to be obtained by a single AD conversion operation. The voltage of the second input terminal to which the reference signal Ramp is applied is changed higher to a predetermined voltage, and thus digital data in which the signal component ($V_S - V_R$) superimposed the offset component ($V_{RST}$) is obtained. However, the offset component is possible to be suppressed by calculating digital data of the offset component using data of a light-shielding pixel or a dummy pixel disposed in the imaging unit 2 and subtracting the digital data of the offset component from the measurement value of the measuring unit 32.

Further, in the present embodiment, the AD conversion operation that does not undergo gain reduction resulting from the arrangement of the capacitive element is possible to be performed.

The exemplary embodiments of the present invention have been described above, but the present invention is not limited to the above embodiments. Additions, omissions, replacements, and other alternations can be made in a range not departing from the gist of the present invention. The present invention is not limited to the above description but confined only by the accompanying claims.

What is claimed is:
1. An imaging device, comprising:
an imaging unit that includes unit pixel with a photoelectric conversion element arranged in a form of a matrix, and outputs a pixel signal from the unit pixel;
a reference signal generating unit that generates a reference signal increasing or decreasing with passage of time;
a comparing unit that includes a differential amplifying unit and a reset unit, the differential amplifying unit including a first input terminal electrically connected with the unit pixel and a second input terminal electrically connected with the reference signal generating unit through a first capacitive element and comparing a voltage of the first input terminal with a voltage of the second input terminal, the reset unit resetting the voltage of the first input terminal and the voltage of the second input terminal;
a measuring unit that measures a comparison time from a comparison start to a comparison end by the comparing unit; and
a changing unit that changes the voltage of the second input terminal such that a voltage difference between the first input terminal and the second input terminal becomes a voltage guaranteeing a comparison operation by the comparing unit after a reset operation by the comparing unit,
wherein the changing unit includes a second capacitive element and a switching element, one end of the second capacitive element is connected to the second input terminal, and the other end of the second capacitive element is connected to a first voltage source during a reset operation by the reset unit and to a second voltage source different from the first voltage source after the reset operation by the reset unit through the switching element.

2. The imaging device according to claim 1,
wherein the first voltage source is either a ground or a power source, and the second voltage source is the reference signal.

3. The imaging device according to claim 2,
wherein the reference signal generating unit includes a third capacitive element and a constant current source, and generates the reference signal based on a voltage of one end of the third capacitive element by increasing or decreasing a voltage based on a current generated by the constant current source with respect to the voltage of the third voltage source after setting a voltage of one end of the third capacitive element to a voltage of a third voltage source.

4. The imaging device according to claim 1,
wherein the reference signal generating unit includes a third capacitive element and a constant current source, and generates the reference signal based on a voltage of one end of the third capacitive element by increasing or decreasing a voltage based on a current generated by the constant current source with respect to the voltage of the third voltage source after setting a voltage of one end of the third capacitive element to a voltage of a third voltage source.

* * * * *